United States Patent

Aoai et al.

Patent Number: 6,013,411
Date of Patent: Jan. 11, 2000

[54] POSITIVE WORKING PHOTOSENSITIVE COMPOSITION

[75] Inventors: Toshiaki Aoai; Toru Fujimori; Tsukasa Yamanaka; Kazuya Uenishi, all of Shizuoka, Japan

[73] Assignee: Fuji Photo Film Co., Ltd., Kanagawa, Japan

[21] Appl. No.: 08/794,890

[22] Filed: Feb. 5, 1997

[30] Foreign Application Priority Data

Feb. 5, 1996 [JP] Japan .................................. 8-019001

[51] Int. Cl.$^7$ ........................................... G03F 7/004
[52] U.S. Cl. ...................... 430/270.1; 430/905; 430/920; 430/921; 522/31
[58] Field of Search ................. 430/170, 270.1, 430/905, 920, 921; 522/31

[56] References Cited

U.S. PATENT DOCUMENTS

| | | | |
|---|---|---|---|
| 5,352,564 | 10/1994 | Takeda et al. | 430/270.1 |
| 5,558,976 | 9/1996 | Urano et al. | 430/170 |
| 5,683,856 | 11/1997 | Aoai et al. | 430/270.1 |
| 5,688,628 | 11/1997 | Oie et al. | 430/270.1 |

FOREIGN PATENT DOCUMENTS

| | | |
|---|---|---|
| 0476865 | 3/1992 | European Pat. Off. . |
| 0704762 | 4/1996 | European Pat. Off. . |
| 4409220 | 11/1994 | Germany . |

*Primary Examiner*—John S. Chu
*Attorney, Agent, or Firm*—Sughrue, Mion, Zinn, Macpeak & Seas, PLLC

[57] ABSTRACT

A positive working photosensitive composition comprising a resin having repeating units represented by the following formulae (I), (II) and (III), respectively and a compound which generates an acid with irradiation of an active ray or radiation:

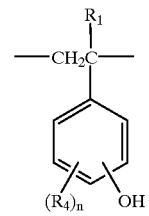

(I)

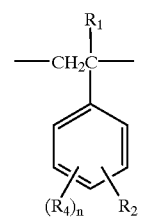

(II)

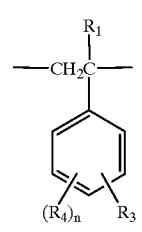

(III)

wherein $R_1$ represents a hydrogen atom or a methyl group; $R_2$ represents $-C(=O)-O-C(R_6)(R_7)(R_8)$ or $-O-R_5-C(=O)-O-(R_6)(R_7)(R_8)$; $R_3$ represents $-O-C(R_6)(R_7)(R_8)$, $-O-Si(R_6)(R_7)(Rs)$ or $-O-C(R_9)(R_{10})-OR_{11}$; $R_4$ represents a hydrogen atom, a halogen atom, an alkyl group, an aryl group, an alkoxy group, an acyl group or an acyloxy group; $R_5$ represents an alkylene group; $R_6$, $R_7$, $R_8$, $R_9$ and $R_{10}$ each independently represents a hydrogen atom, an alkyl group, a cycloalkyl group or an alkenyl group, provided that at least two among $R_6$, $R_7$ and $R_8$ are groups other than a hydrogen atom; $R_{11}$ represents an alkyl group or an aryl group; two groups selected from $R_6$, $R_7$ and $R_8$ and two groups selected from $R_9$, $R_{10}$ and $R_{11}$, each two groups may be combined to form a ring; and n is an integer from 1 to 3.

8 Claims, No Drawings

POSITIVE WORKING PHOTOSENSITIVE COMPOSITION

FIELD OF THE INVENTION

The present invention relates to a positive working photosensitive composition used in the processes of producing a lithographic printing plate, a semiconductor device such as IC, or a circuit substrate for liquid crystal, a thermal head or the like, and in other photofabrication processes.

BACKGROUND OF THE INVENTION

A composition containing an alkali-soluble resin and a naphthoquinone diazide compound as a photosensitive substance has been generally used as a positive type photo-resist composition. For instance, U.S. Pat. Nos. 3,666,473, 4,115,128, and 4,173,470, etc. disclose "novolac type phenol resin/naphthoquinone diazide substituted compound" and L. F. Thompson discloses in "Introduction to Microlithography" (ACS Publisher, No. 2, Vol. 19, pp.112–121) discloses an example of "a novolac resin comprising cresol-formaldehyde/sulfonic ester of trihydroxybenzophenone-1, 2-naphthoquinone diazide" as the most typical composition.

In such a positive photo-resist basically comprising a novolac resin and a quinone diazide compound, the novolac resin provides high resistance to plasma etching and the naphthoquinone diazide acts as a dissolution inhibitive compound. In addition, the naphthoquinone diazide forms a carboxylic acid when undergoing a light irradiation, thereby losing the dissolution-inhibiting ability, to enhance the alkali solubility of the novolac resin.

Up to date, various positive photo-resists containing a novolac resin and a naphthoquinone diazide photosensitive substance have been developed and put into a practical use from such a viewpoint, and they have sufficient results in a line width process of approximately 0.8 to 2 μm.

However, an integrated circuit increasingly has an enhanced integration degree, and in the production of a semiconductor substrate such as a super LSI, it has been required to process a super fine pattern comprising a line width of half micron or less. In order to attain the required resolution, a wavelength of the exposing machine used in a photographic lithography has become more small wavelength. At the present, the use of a far ultraviolet ray or an excimer laser ray (e.g., XeCl, KrF, ArF, etc.) has been considered.

However, when the conventional resist comprising a novolac and a naphthoquinone diazide compound is used for the formation of a lithographic pattern with a far ultraviolet ray or a excimer laser, since the novolac and the naphthoquinone diazide have strong absorptions at a far ultraviolet region, the light is difficult to arrive at the bottom of the resist and, thus, only a low sensitive pattern having a taper can be obtained.

As one means for solving the problem, U.S. Pat. No. 4,491,628, European Patent 249,139, etc. disclose chemically amplified resist compositions. The chemically amplified positive type resist composition is a pattern-forming material in which an acid is formed on an exposed portion with the irradiation such as far ultraviolet ray, and the solubilities in a developer on the radiation-exposed portion and the unexposed portion are caused to be changed by a reaction with the aid of this acid, thereby forming a pattern on a substrate.

Examples which can be mentioned include a combination of a compound which generates an acid by photochemical decomposition with an acetal or O, N-acetal compound (JP-A-48-89003; the term "JP-A" as used herein means Japanese unexamined patent publication), a combination of a compound which generates an acid by photochemical decomposition with an ortho ester or amide ester compound (JP-A-51-120714), a combination of a compound which generates an acid by photochemical decomposition with a polymer having an acetal or ketal group in the main chain (JP-A-53-133429), a combination of a compound which generates an acid by photochemical decomposition with an enol ether (JP-A-55-12995), a combination of a compound which generates an acid by photochemical decomposition with an N-acylimino carbonic acid compound (JP-A-55-126236), a combination of a compound which generates an acid by photochemical decomposition with a polymer having an ortho ester group in the main chain (JP-A-56-17345), a combination of a compound which generates an acid by photochemical decomposition with a tertiary alkyl ester (JP-A-60-3625), a combination of a compound which generates an acid by photochemical decomposition with a silyl ester (JP-A-60-10247), a combination of a compound which generates an acid by photochemical decomposition with a silyl ether (JP-A-60-37549 and JP-A-60-121446), etc. Since the quantum yield exceeds 1 in principle they exhibit a high sensitivity.

Similarly, examples of the systems which are stable with the elapse of time at room temperature but which are decomposed by being heated in the presence of an acid to show an alkali-solubility include combinations of a compound which generate an acid by exposure with an ester of a tertiary or secondary carbon (e.g., t-butyl or 2-cyclohexenyl) or a carbonate compound, for example, as described in JP-A-59-45439, JP-A-60-3625, JP-A-62-229242, JP-A-63-27829, JP-A-63-36240, JP-A-63-250642, Polym. Eng. Sce. Vol. 23, p. 1012 (1983), ACS. Sym. Vol. 242, p. 11 (1984), Semiconductor World, November (1987), p. 91, Macromolecules, Vol. 21, p. 1475, (1988), and SPIE, Vol. 920, p. 42 (1988). These systems also possess high sensitivity and have a small absorption at a deep UV region in comparison with the naphthoquinone diazide/novolac resin; thus, they can be considered to be systems effective for shortening the wavelength of the light source described above.

The positive type chemically amplified resists described above can be roughly classified into three-component systems comprising an alkali soluble resin, a compound which generates an acid through exposure with irradiation (a photo-acid generator) and a dissolution inhibitive compound which becomes alkali-soluble by a catalytic reaction with an acid (an acid-decomposable dissolution inhibitive compound), and two-component systems comprising a resin possessing a group which becomes alkali-soluble by a reaction with an acid and a photo-acid generator.

The two-component or three-component positive resist of chemical amplification type forms a resist pattern by undergoing decomposition upon heat treatment in the presence of the acid generated from a photoacid generator by exposure and then being submitted to development. The positive resist of such a type has a problem such that, in proportion to the standing period from exposure to heat treatment (PEB treatment), the generated acid diffuses farther and the acid situated in the surface part of the resist is subject to inactivation by basic impurities in the atmosphere, thereby causing changes in not only sensitivity but also profile (T-top shape) and line width of a resist pattern obtained after development. In particular, the lowering of sensitivity and the formation of a T-top shape come into a great problem in the case of acid decomposable groups of the type which are relatively large in activation energy required for acid decomposition, such as a t-BOC group and a t-butylester group. On the other hand, acid decomposable groups of the type which are small in activation energy required for acid decomposition, such as an acetal group, a tetrahydropyranyl ether group and a silyl ether group, offer a problem of thinning the line width of a resist pattern although they can mitigate the aforementioned drawbacks. Further, those groups produce the phenolic OH groups upon acid decomposition, and thereby the dissolution accelerating effect is rendered insufficient; as a result, solubility discrimination between before and after exposure becomes insufficient. Thus, the resolution and the defocus latitude obtained thereby are still insufficient.

As means to solve such problems, the arts of using groups capable of producing a carboxylic acid in the presence of an acid generated are disclosed in JP-B-02-27660 (the term "JP-B" as used herein means an "examined Japanese patent publication"), JP-A-05-181279 (the term "JP-A" as used herein means an "unexamined published Japanese patent application"), JP-A-06-83059, JP-A-06-282073 and European Patent 366,590.

However, as previously mentioned, those arts are still unsuccessful in reducing a change of pattern shape (formation of T-top) and a variation (lowering) of sensitivity due to a lapse of time after exposure.

On the other hand, the arts of using the resins having groups which are liable to decompose by the action of an acid (small in activation energy required for acid decomposition) and hard to cause a change in pattern shape and a variation of sensitivity are disclosed in JP-A-02-25850, JP-B-03-44290, JP-A-04-211258, JP-A-05-19482, JP-A-05-249682, JP-A-06-167811, JP-A-06-273934 and European Patent 447,868.

However, dissolution accelerating effect cannot be produced by those arts; as a result, the solubility of exposed areas in an alkaline developer becomes insufficient, and so the resolution and the pattern profile obtained are not satisfactory.

SUMMARY OF THE INVENTION

Therefore, an object of the present invention is to provide a positive working photosensitive composition which can exhibit an enhanced dissolution accelerating effect after exposure to afford improved developability, and further enables the resist film made therefrom to undergo no changes in pattern shape and sensitivity with a lapse of time after exposure to effect improvements in sensitivity, resolution and pattern profile.

As a result of our intensive studies given to the above-described characteristic problems, it has been found that the object of the present invention can be attained by using a resin comprising the specific components illustrated below in a positive-working chemical amplification system, thereby achieving the present invention.

More specifically, the present invention has the following constitution (1), (2) or (3):

(1) A positive working photosensitive composition comprising a resin having repeating units represented by the following formulae (I), (II) and (III) and a compound which generates an acid with irradiation of an active ray or radiation:

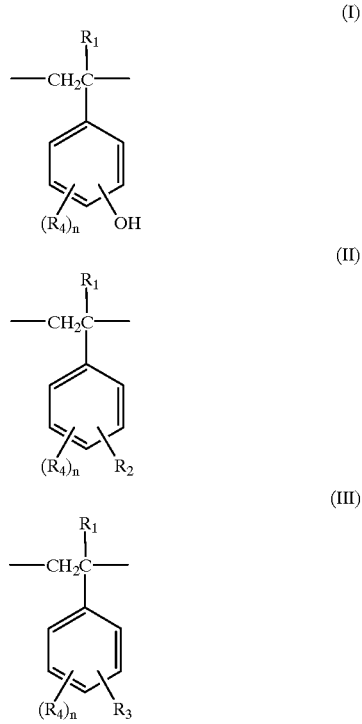

wherein $R_1$ represents a hydrogen atom or a methyl group;

$R_2$ represents —C(=O)—O—C($R_6$)($R_7$)($R_8$) or —O—$R_5$—C(=O)—O—C($R_6$)($R_7$)($R_8$);

$R_3$ represents —O—C($R_6$)($R_7$)($R_8$)—O—Si($R_6$)($R_7$)($R_8$) or —O—C($R_9$)($R_{10}$)—O$R_{11}$;

$R_4$ represents a hydrogen atom, a halogen atom, an alkyl group, an aryl group, an alkoxy group, an acyl group or an acyloxy group;

$R_5$ represents an alkylene group;

$R_6$, $R_7$, $R_8$, $R_9$ and $R_{10}$, which may be the same or different, each represents a hydrogen atom, an alkyl group, a cycloalkyl group or an alkenyl group, provided that at least two among $R_6$, $R_7$ and $R_8$ are groups other than a hydrogen atom;

$R_{11}$ represents an alkyl group or an aryl group;

two groups selected from $R_6$, $R_7$ and $R_8$ may be combined with each other to form a ring;

two groups selected from $R_9$, $R_{10}$ and $R_{11}$ may be combined with each other to form a ring;

and n is an integer from 1 to 3.

(2) A positive working photosensitive composition according to the constitution (1), further comprising a low molecular acid-decomposable dissolution inhibitve compound which has a molecular weight of not higher than 3,000 and a group capable of decomposing due to an acid and can increase its solubility in an alkali developer by undergoing the action of an acid.

(3) A positive working photosensitive composition according to the constitution (1) or (2), further comprising a resin insoluble in water but soluble in an alkaline aqueous solution.

By using a high molecular weight resin comprising the constituents of the foregoing formulae (I), (II) and (III) in a resist of chemical amplification type, as described above, the effect of promoting dissolution after exposure and the effect of diminishing changes in pattern profile and sensitivity due to a lapse of time after exposure are considerably enhanced. As a reason for enhancement of those effects, though details thereof are unknown, it is thought that the presence of the foregoing constituents in one molecule of the resin results in an increase in compatibility between resin molecules and enables adequate mutual interaction of the constituents, as compared with the case where the constituents are contained in separate resins and these resins are mixed.

DETAILED DESCRIPTION OF THE INVENTION

The compounds used in the present invention are described below in detail.

First, the resin comprising the constitutional repeating units of the foregoing formulae (I), (II) and (III) (hereinafter referred to as "Resin X") is illustrated.

Suitable examples of each group as $R_4$ and $R_6$ to $R_{11}$, which can be contained in the foregoing units are exemplified below. Examples of the halogen atom include fluorine, chlorine, bromine and iodine atoms. Examples of the alkyl group include an alkyl group containing 1 to 8 carbon atoms, such as methyl, ethyl, propyl, n-butyl, sec-butyl, t-butyl, hexyl and octyl. Examples of the cycloalkyl group include a cycloalkyl group containing 3 to 10 carbon atoms, such as cyclopropyl, cyclobutyl, cyclopentyl, cyclohexyl and adamantyl. Examples of the alkenyl group include an alkenyl group containing 2 to 4 carbon atoms, such as vinyl, propenyl, allyl and butenyl. Examples of the aryl group include an aryl group containing 6 to 14 carbon atoms, such as phenyl, xylyl, toluyl, cumenyl, naphthyl and anthryl. Examples of the alkoxy group include an alkoxy group containing 1 to 4 carbon atoms, such as methoxy, ethoxy, hydroxyethoxy, propoxy, hydroxypropoxy, n-butoxy, isobutoxy, sec-butoxy and t-butoxy. Examples of the acyl group include an acyl group containing 1 to 7 carbon atoms, such as formyl, acetyl, propanoyl, butanoyl and benzoyl. Examples of the acyloxy group include an acyloxy group containing 2 to 7 carbon atoms, such as acetoxy, propanoyloxy, butanoyloxy and benzoyloxy.

As for the alkylene group (divalent aliphatic group) represented by $R_5$, examples thereof include an alkylene group containing 1 to 6 carbon atoms, such as methylene, 1,2-ethylene, 1,1-ethylene, 1,3-propylene, 2,2-propylene, 1,4-butylene and 1,6-hexylene.

Resin X can be synthesized according to conventional methods.

For instance, Resin X can be prepared using a method wherein a monomer from which the constitutional unit of formula (I) originates (which is called a monomer (I) hereinafter) is polymerized alone or together with another monomer to prepare a resin and then the resin are modified or converted so that OH groups thereof are replaced partly by $R_2$ of formula (II) and partly by $R_3$ of formula (III); a method of copolymerizing a monomer (I) and monomers from which the constitutional units of formulae (II) and (III) originate respectively (which are hereinafter called a monomer (II) and a monomer (III) respectively; or a method wherein monomers (II) and (III) are polymerized alone or together with another monomer to prepare a resin and then the resin is hydrolyzed so that part of $R_2$ or/and $R_3$ groups therein are converted into OH groups to have the constitutional units represented by formula (I).

More specifically, a monomer (I) is polymerized alone or together with another monomer by using an appropriate solvent and an appropriate catalyst in accordance with a radical polymerization method as described, e.g., in JP-A-02-25850, JP-A-03-223860, JP-A-04-211258 and JP-A-05-249682, and OH groups in the resin obtained are modified or converted so as to be replaced partly by $R_2$ groups and partly by $R_3$ groups according to the methods described, e.g., in JP-A-60-52845, JP-A-05-19482, JP-A-04-219757, JP-A-04-251259, JP-A-05-249682, JP-A-04-211258, JP-A-05-181279, JP-A-06-83059 and JP-A-06-194841, thereby synthesizing Resin X. Also, Resin X can be synthesized by copolymerizing monomers (I), (II) and (III), if desired, together with other monomers in accordance with a radical polymerization method as cited above. Further, Resin X can be synthesized using a method wherein monomers (II) and (III) are polymerized alone or together with another monomer using a radical polymerization method as cited above or a living anion polymerization method described, e.g., in JP-A-04-350657, JP-A-04-350658, JP-A-06-41221, JP-A-06-41222, JP-A-06-65332 and JP-A- 06-65333, and then part of $R_2$ or/and $R_3$ groups of the resin obtained are made to undergo hydrolysis to be converted into OH groups, thereby introducing the constitutional units represented by formula (I) into the resin, and further the remaining $R_2$ and/or $R_3$ groups are in part subjected to modification or conversion in order to adjust their contents to intended values.

Specific examples of a monomer (I) are illustrated below. However, these examples should not be construed as limiting on the scope of the present invention in any way.

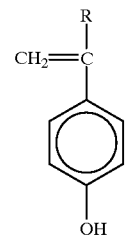

(I-1)

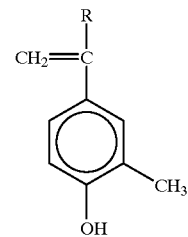

(I-2)

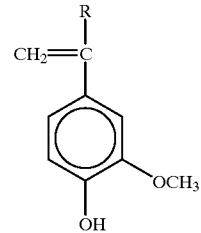

(I-3)

(I-4) 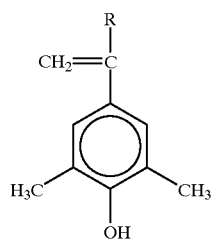
(I-5) 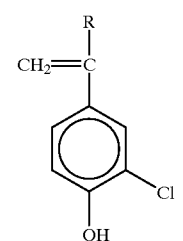
(I-6) 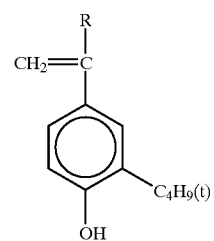
(I-7) 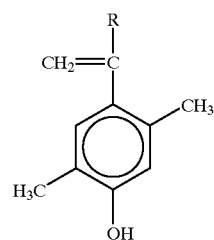
(I-8) 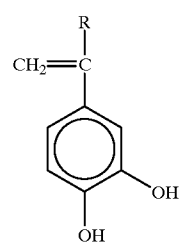
(I-9) 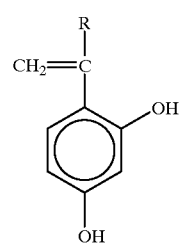
(I-10) 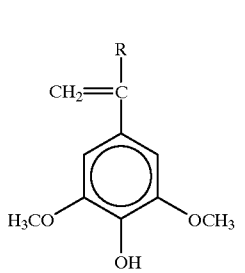
(I-11) 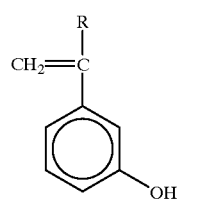
(I-12) 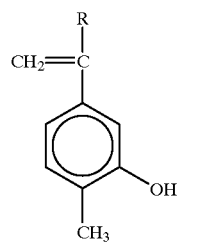
(I-13) 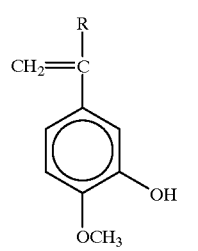
(I-14) 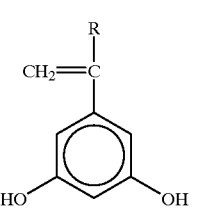
(I-15) 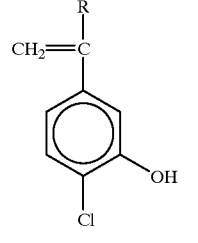

(I-16) 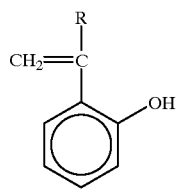

(I-17) 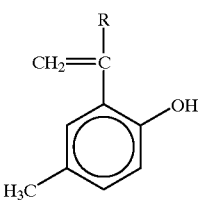

(I-18) 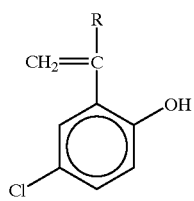

(I-19) 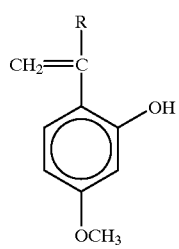

(I-20) 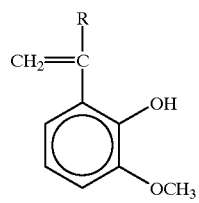

(I-21) 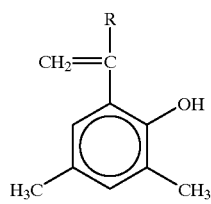

(I-22) 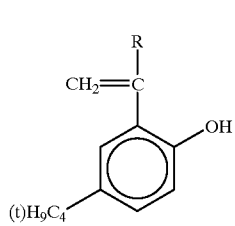

(I-23) 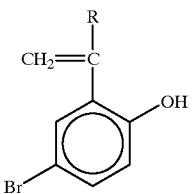

In the structural formulae illustrated above, each R is a hydrogen atom or a methyl group.

As specific examples of a monomer (II), mention may be made of the compounds obtained by substituting the following groups respectively for the OH group in each of Compounds (I-1) to (I-23) illustrated above:

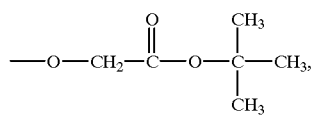

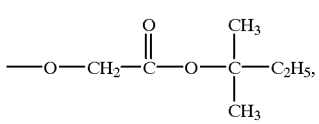

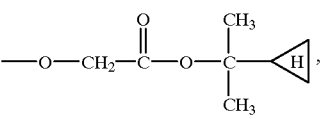

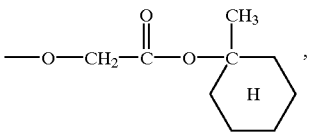

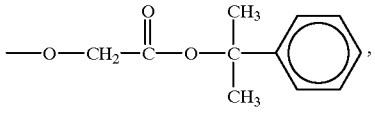

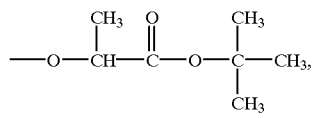

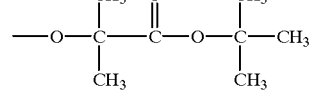

Further, the compounds illustrated below can be examples of a monomer (II), but these examples should not be construed as limiting on the scope of the invention in any way.

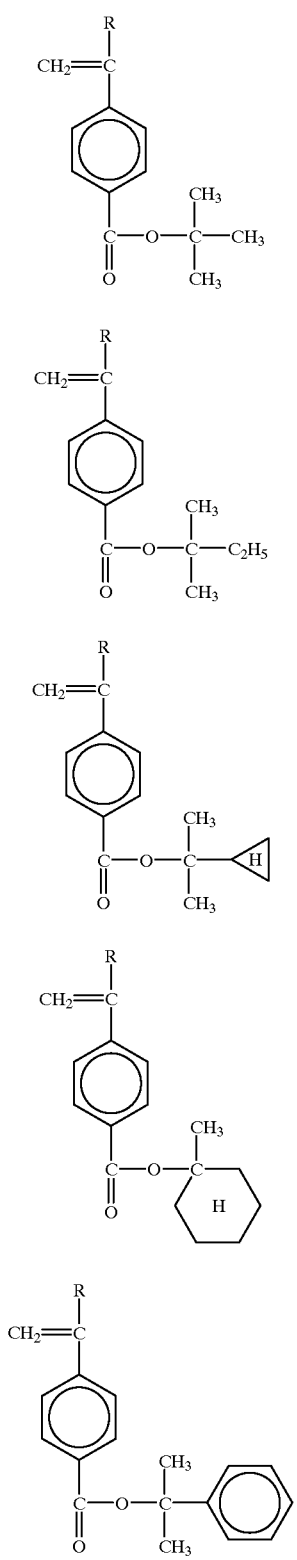

(II-1)

(II-2)

(II-3)

(II-4)

(II-5)

In the above structural formulae, each R represents a hydrogen atom or a methyl group.

As specific examples of a monomer (III), mention may be made of the compounds obtained by substituting the following groups respectively for the OH group in each of Compounds (I-1) to (I-23) illustrated hereinbefore. However, the monomer (III) should not be construed as being limited to these examples.

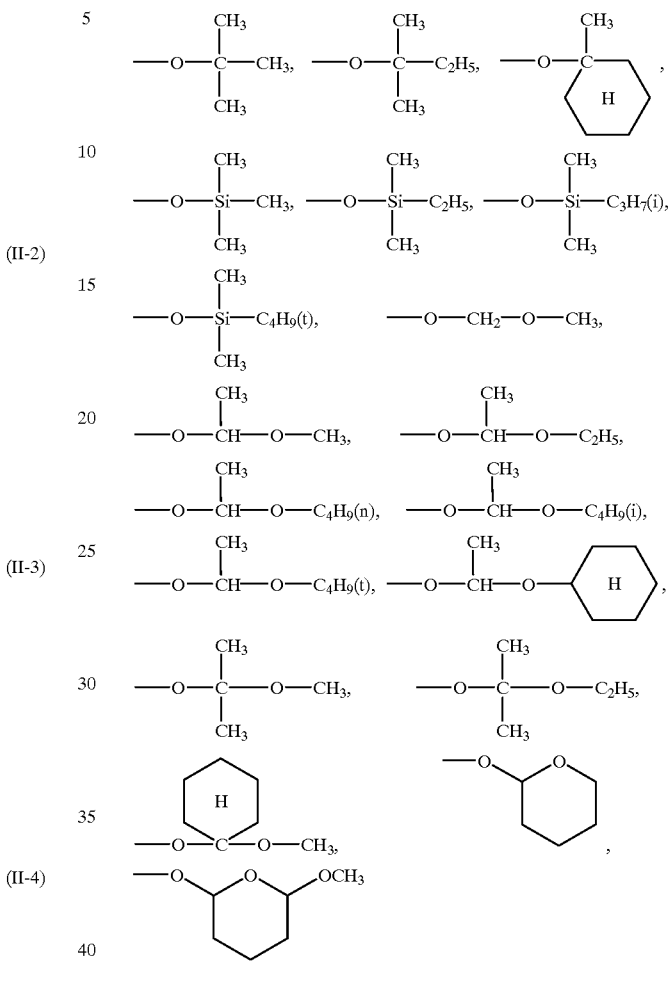

As for other copolymerizable monomers, i.e., monomers which can be copolymerized with the monomers (I), (II) and (III) according to the present invention, compounds having at least one addition polymerizable unsaturated bond, such as acrylic acid esters, acrylamides, methacrylic acid esters, methacrylamides, allyl compounds, vinyl ethers, vinyl esters, styrenes and crotonic acid esters, are examples thereof.

More specifically, the compounds usable for such copolymerization include acrylic acid esters, such as alkyl (preferably having 1 to 10 carbon atoms) acrylates (e.g., methyl acrylate, ethyl acrylate, propyl acrylate, t-butyl acrylate, t-amyl acrylate, ethylhexyl acrylate, octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate, 2-tetrahydropyranyl acrylate), aryl acrylates (e.g., phenyl acrylate) and silyl acrylates (e.g., t-butyldimethylsilyl acrylate); methacrylic acid esters, such as alkyl (preferably having 1 to 10 carbon atoms) methacrylates (e.g., methyl methacrylate, ethyl methacrylate, propyl methacrylate, isopropyl methacrylate, t-butyl methacrylate, t-amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate, 2-tetrahydropyranyl methacrylate), aryl methacrylates (e.g., phenyl methacrylate, cresyl methacrylate, naphthyl methacrylate) and silyl methacrylates (e.g., trimethylsilyl methacrylate, t-butyldimethylsilyl methacrylate); acrylamides, such as acrylamide, N-alkylacrylamides (the alkyl moieties of which are those containing 1 to 10 carbon atoms, with examples including methyl, ethyl, propyl, butyl, t-butyl, heptyl, octyl, cyclohexyl, benzyl and hydroxyethyl), N-arylacrylamides (the aryl moieties of which are, e.g., phenyl, tolyl, nitrophenyl, naphthyl, cyanophenyl, hydroxyphenyl and so on), N,N-dialkylacrylamides (the alkyl moieties of which are those containing 1 to 10 carbon atoms, with examples including methyl, ethyl, butyl, isobutyl, ethylhexyl and cyclohexyl), N,N-diarylacrylamides (the aryl moieties of which are, e.g., phenyl and so on), N-methyl-N-phenylacrylamide, N-hydroxyethyl-N-methylacrylamide and N-2-acetamidoethyl-N-acetylacrylamide; methacrylamides, such as methacrylamide, N-alkylmethacrylamides (the alkyl moieties of which are those containing 1 to 10 carbon atoms, with examples including methyl, ethyl, t-butyl, ethylhexyl, hydroxyethyl and cyclohexyl), N-arylmethacrylamides (the aryl moieties of which are, e.g., phenyl, hydroxyphenyl, carboxyphenyl and so on), N,N-dialkylmethacrylamides (the alkyl moieties of which are, e.g., ethyl, propyl butyl and so on), N,N-diarylmethacrylamides (the aryl moieties of which are, e.g., phenyl and so on), N-hydroxyethyl-N-methylmethacrylamide, N-methyl-N-phenylmethacrylamide and N-ethyl-N-phenylmethacrylamide; allyl compounds, such as allyl esters (e.g., allyl acetate, allyl caproate, allyl caprate, allyl laurate, allyl palmitate, allyl stearate, allyl benzoate, allyl acetoacetate, allyl lactate) and allyloxy ethanol; vinyl ethers, such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether) and vinyl aryl ethers (e.g., vinyl phenyl ether, vinyl tolyl ether, vinyl chlorophenyl ether, vinyl-2,4-dichlorophenyl ether, vinyl naphthyl ether, vinyl anthranyl ether); vinyl esters, such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-A-phenyl butyrate, vinyl chlorohexylcarboxylate, vinyl benzoate, vinyl salicylate, vinyl chlorobenzoate, vinyl tetrachlorobenzoate and vinyl naphthoate; styrenes, such as styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene), alkoxystyrenes (e.g., methoxystyrene, 4-methoxy-3-methylstyrene, dimethoxystyrene), halogenostyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluromethylstyrene, 4-fluoro-3-trifluoromethylstyrene), 4-acetoxystyrene, 4-carboxystyrene and a-methylstyrene; crotonic acid esters, such as alkyl crotonates (e.g., butyl crotonate, hexyl crotonate, glycerine monocrotonate); dialkyl itaconates (e.g., dimethyl itaconate, diethyl itaconate, dibutyl itaconate); dialkyl maleates or fumarates (e.g., dimethyl maleate, dibutyl fumarate); acrylic acid, methacrylic acid, maleimide, acrylonitrile, methacrylonitrile, maleinonitrile, fumaronitrile, maleic anhydride, N-alkylmaleimides, and N-arylmaleimides (the aryl moieties of which are, e.g., phenyl and hydroxyphenyl). Further, any other addition polymerizing unsaturated compounds can be used for copolymerization with the monomers (I), (II) and (III) of the present invention.

The monomer (I), the monomer (II), the monomer (III) and the other copolymerizable monomer each can be used alone or as a mixture of two or more of monomers belonging thereto.

The content of the monomer (I) in Resin X is preferably from 30 to 90 mol %, more preferably from 40 to 85 mol %, particularly preferably from 50 to 80 mol %.

The content of the monomer (II) in Resin X is preferably from 3 to 40 mol %, more preferably 5 to 30 mol %, particularly preferably from 10 to 20 mol %.

The content of the monomer (III) in Resin X is preferably from 5 to 40 mol %, more preferably from 10 to 35 mol %, particularly preferably from 15 to 30 mol %.

Further, in the copolymerization for synthesizing Resin X can be used other polymerizing monomers which are chosen so as to introduce an alkali-soluble group, such as phenolic OH and carboxylic group, into Resin X for the purpose of securing satisfactory developability for Resin X upon development with an alkali developer.

The weight average molecular weight (Mw: determined with polystyrene as a standard) of Resin X synthesized in a manner as described above, which comprises the constituents of formulae (I), (II) and (III) according to the present invention, is generally at least 2,000, preferably from 3,000 to 200,000, more preferably from 5,000 to 70,000. As for the molecular weight distribution, it is desirable for Resin X to have the dispersion degree thereof (Mw/Mn) in the range of 1.0 to 4.0, preferably 1.0 to 2.0, particularly preferably 1.0 to 1.6. The heat resistance and image forming characteristics (pattern profile, defocus latitude, etc.) of a resin become better the smaller dispersion degree the resin has.

The content of Resin X in the present photosensitive composition (excluding a coating solvent) is preferably from 50 to 99% by weight, more preferably from 70 to 97% by weight.

Specific examples of Resin X are illustrated below, but these examples should not be construed as limiting on the scope of the invention in any way.

In the following structural formulae, the molar ratio l/m/n ranges from 70/10/20 to 50/20/30, and the molar ratio l/m/n/p ranges from 70/10/10/10 to 40/20/20/20.

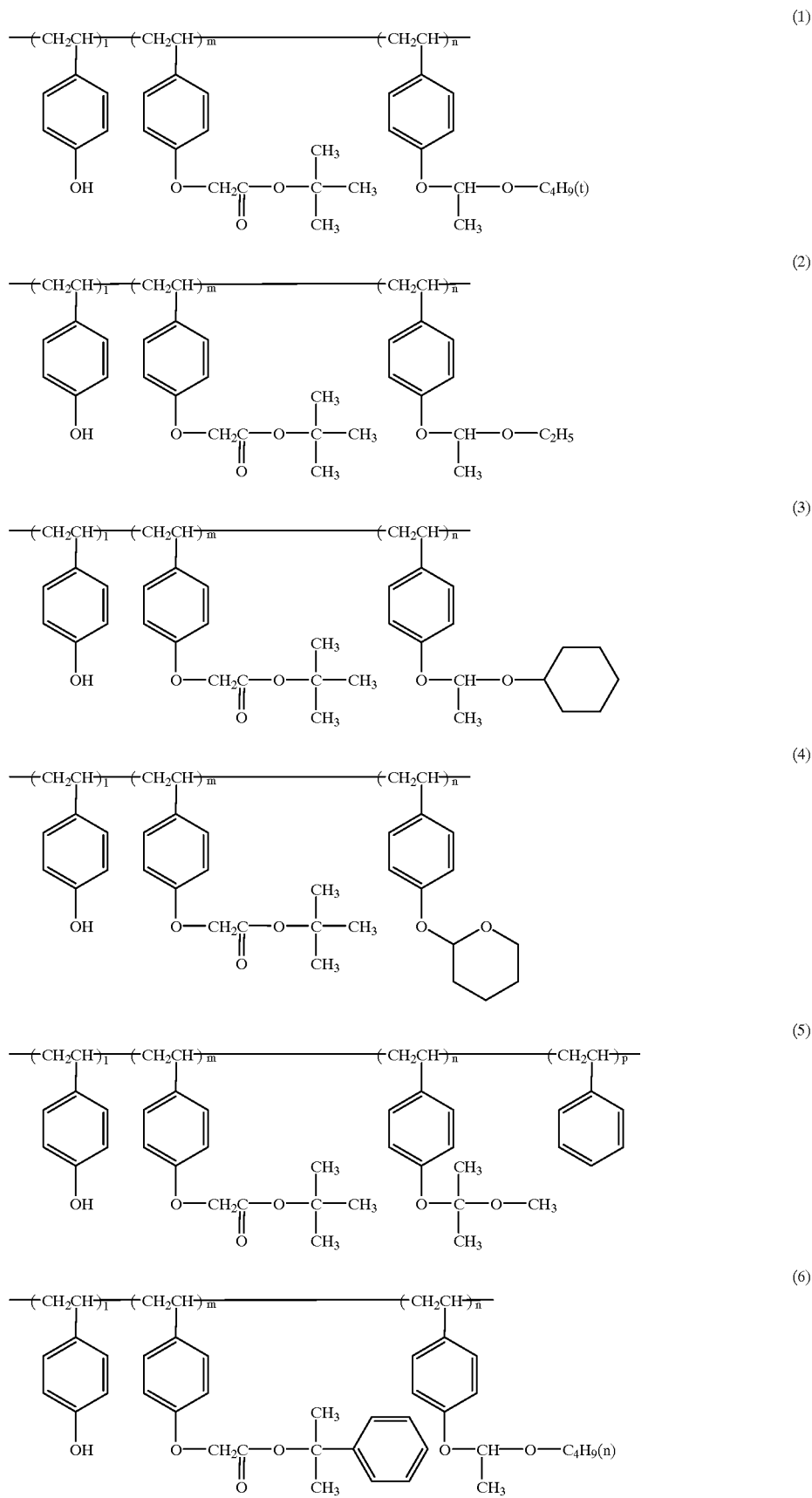

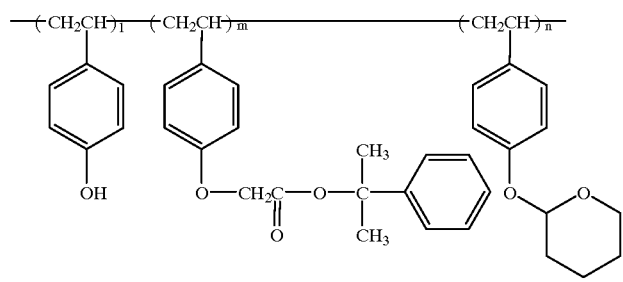
(7)
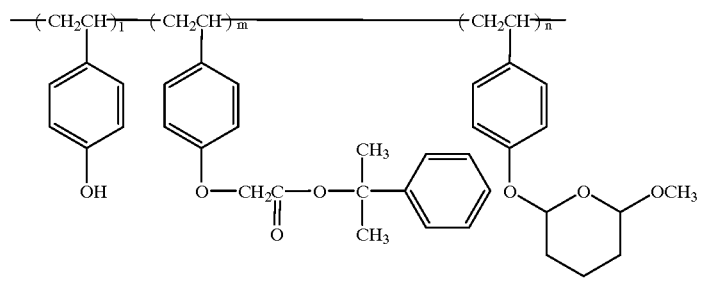
(8)
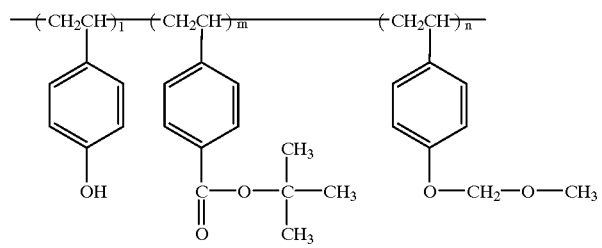
(9)
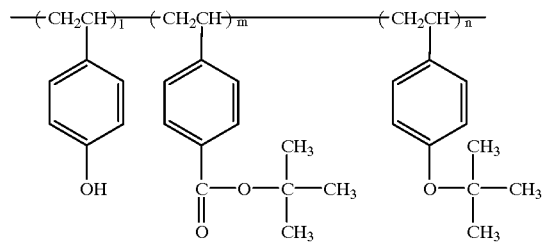
(10)
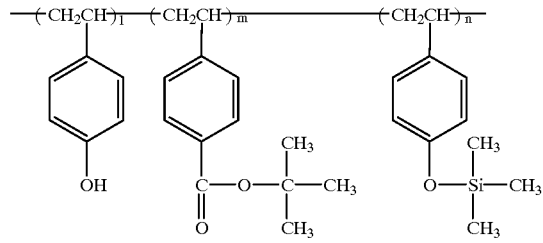
(11)
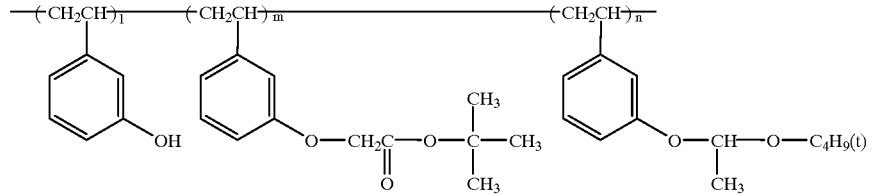
(12)

-continued
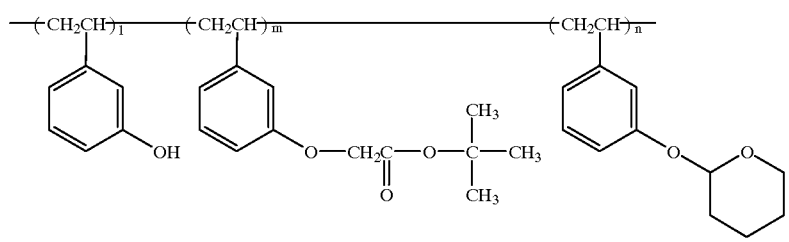
(13)
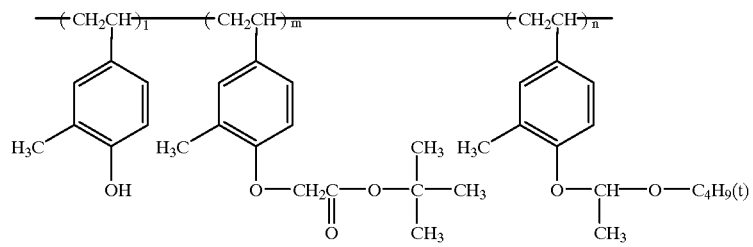
(14)
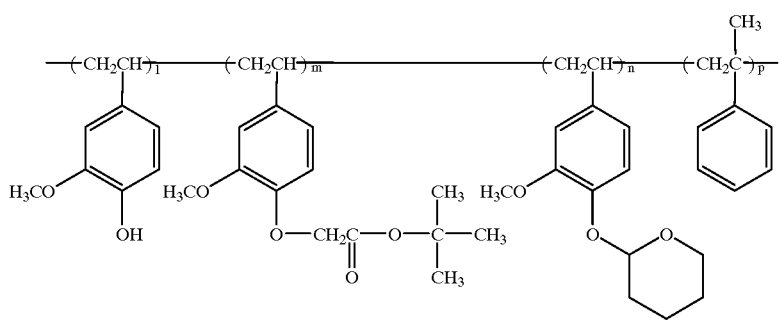
(15)
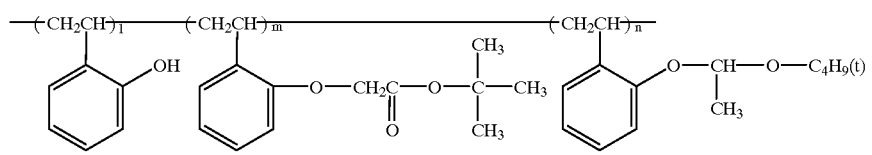
(16)
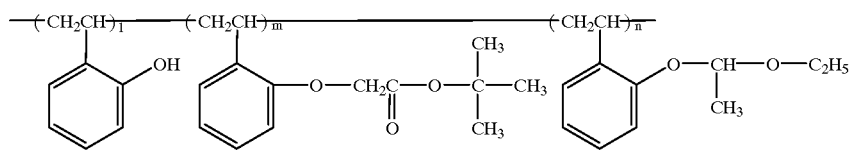
(17)
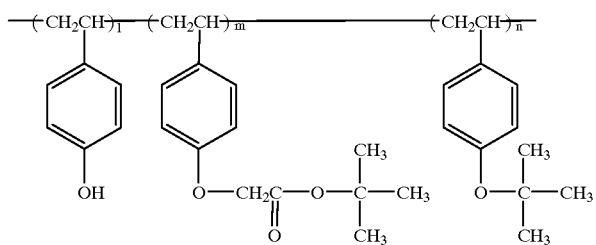
(18)

-continued
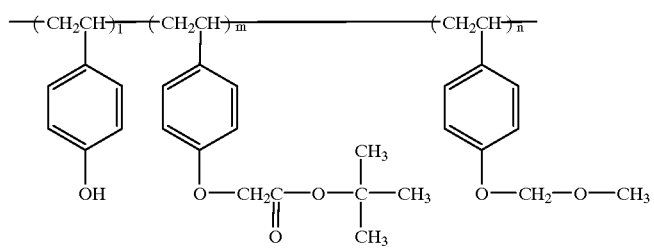
(19)
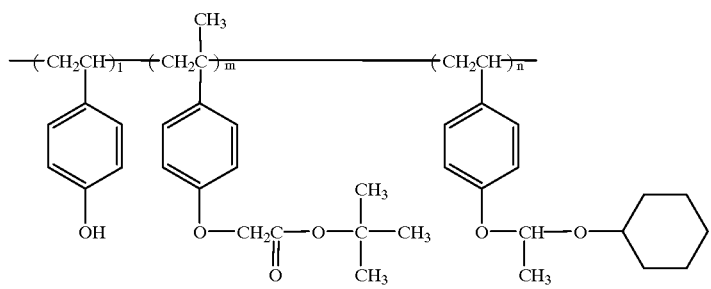
(20)
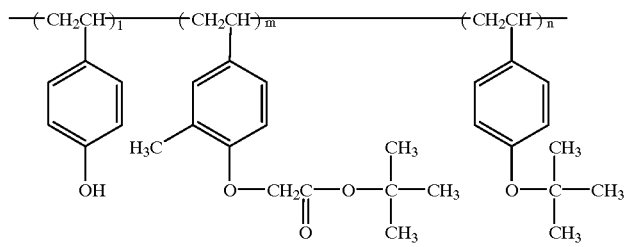
(21)
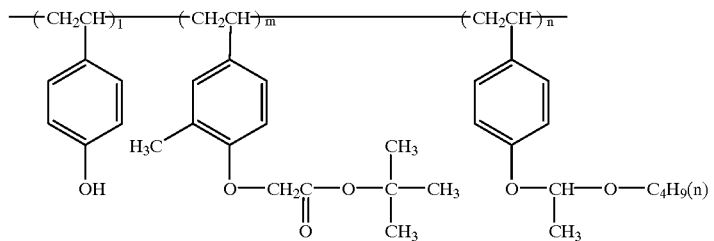
(22)
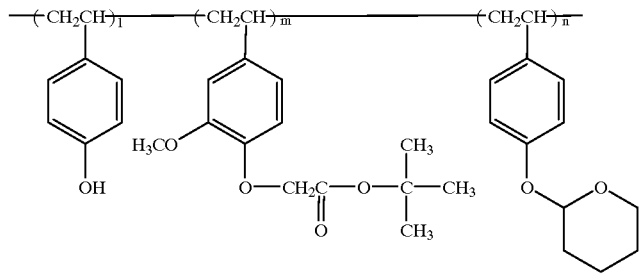
(23)

-continued
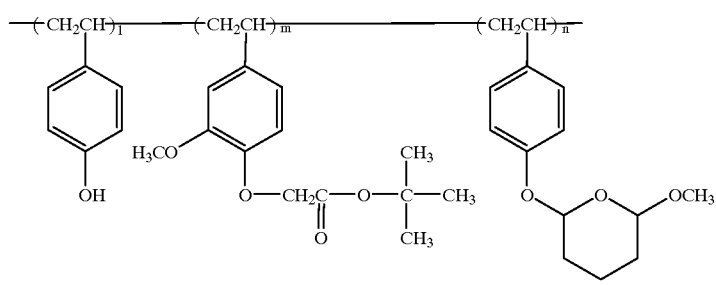
(24)
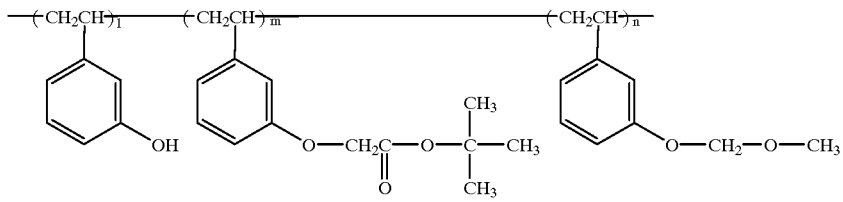
(25)
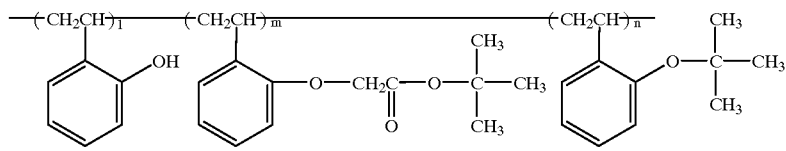
(26)
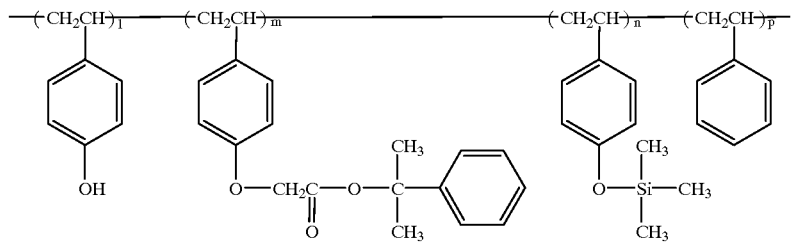
(27)
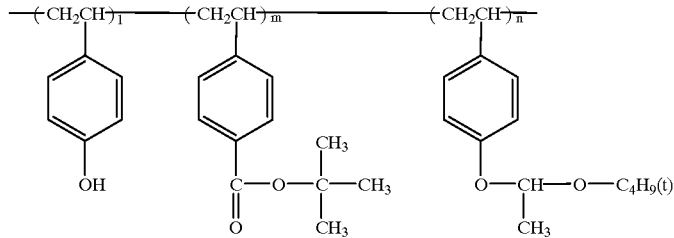
(28)
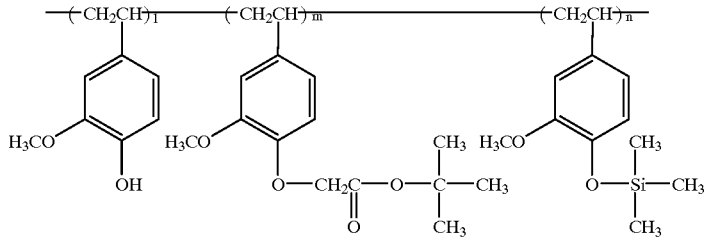
(29)

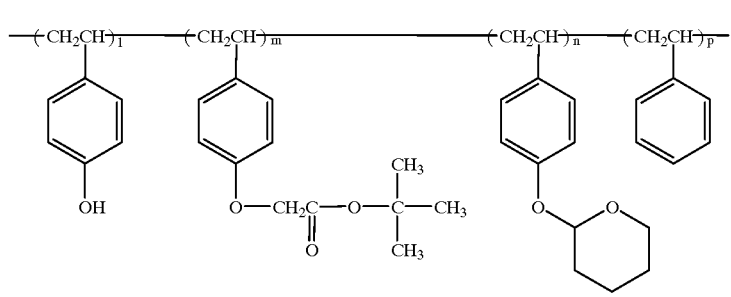

(30)

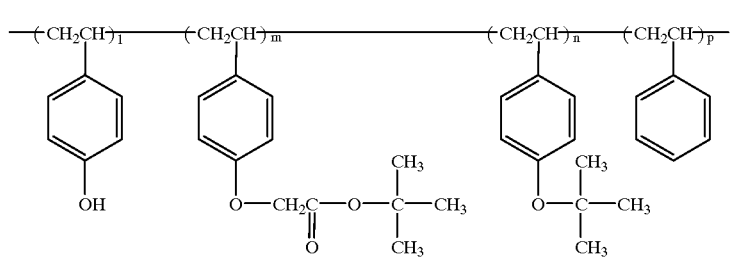

(31)

The compounds which generate an acid with irradiation of an active ray or radiation are described below.

The compound which generates an acid with irradiation of an active ray or radiation can be suitably selected from photochemical initiators for photochemical cation polymerization, photochemical initiators for a photochemical radical polymerization, photo chemical discoloring agents such as those comprising a dye, photochemical color changing agents and known compounds which generate an acid through light used in micro-resist and a mixture thereof.

Examples thereof include diazonium salts described in S. I. Schlesinger, Photogr. Sci. Eng., 18, 387 (1974), T. S. Bal et al, Polymer, 21, 423 (1980), etc.; ammonium salts described in U.S. Pat. No. 4,069,055 and 4,069,056, U.S. Pat. No. Re 27,992, Japanese Patent Application No. 3-140140, etc.; onium salts such as phosphonium salts described in D. C. Necker et al., Macromolecules, 17, 2468 (1984), C. S. Wen et al., Teh, Proc. Conf. Rad. Curing ASIA, p. 478, Tokyo, Oct. (1988), U.S. Pat. Nos. 4,069,055 and 4,069,056, etc., iodonium salts described in J. V. Crivello et al., Macromolecules, 10 (6) 1307 (1977), Chem. & Eng. News, Nov. 28, p. 31 (1988), European Patent 104,143, U.S. Pat. Nos. 339,049 and 410,201, JP-A-2-150848, JP-A-2-296514, etc., sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patents 370,693, 3,902,114, 233,567, 297,443, and 297,442, U.S. Pat. Nos. 4,933,377, 161,811, 410,201, 339, 049, 4,760,013, 4,734,444, and 2,833,827, German Patents 2,904,626, 3,604,580, and 3,604,581, etc., selenonium salts described in J. V. Crivello et al., Macromolecules, 10 (6), 1307 (1977), J. V. Crivello et al., Polymer Sci., Polymer Chem. Ed., 17, 1047 (1979), etc., arsonium salts described in C. S. Wen et al., Teh, Proc. Conf. Rad. Curing ASIA, p. 478, Tokyo, Oct. (1988), etc., organic halogenides described in U.S. Pat. No. 3,905,815, JP-B-46-4605 (the term "JP-B" as used herein means Japanese examined patent publication), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organometal/organic halogenides described in K. Meier et al., J. Rad. Curing 13 (4), 26 (1986), T. P. Gill et al., Inorg. Chem., 19, 3007 (1980), D. A. struc, Acc. Chem. Res., 19 (12), 377 (1896), JP-A-2-161445, etc.; photo-acid generators having an o-nitrobenzyl type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patents 0290,750, 046,083, 156,535, 271,851, and 0,388,343, U.S. Pat. Nos. 3,901,710 and 4,181,531, JP-A-60-198538, JP-A-53-133022, etc.; compounds which are photochemically decomposed to generate sulfonic acid represented by iminosulfonate described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patents 0199,672, 84515, 199,672, 044, 115, and 0101,122, U.S. Pat. Nos. 4,618,564, 4,371,605, and 4,431,774, JP-A-64-18143, JP-A-2-245756, JP-A-4-365048, etc., and disulfone compounds described in JP-A-61-166544, etc.

Furthermore, compounds in which these groups or compounds which generate an acid through light are introduced in the main chain or a side chain, for example, compounds described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9,625 (1988), Y. Yamada et al, Makromol. Chem., 152, 153, 163 (1972), J. V. Crivello et al., J. Polymer Sci., Polymer Chem. Ed., 17, 3845 (1979), U.S. Patent 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc. can be used.

Moreover, compounds which generate an acid through light described in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778, European Patent 126,712, etc. can also be used.

Of the compounds which generate an acid with irradiation of an active ray or a radiation, those which are particularly used effectively will be described.

(1) Oxazole derivative represented by formula (PAG1) and S-triazine derivative represented by formula (PAG2), each being substituted with a trihalomethyl group.

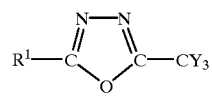
(PAG1)

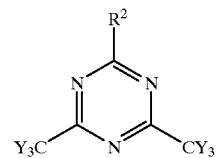
(PAG2)

wherein $R^1$ is a substituted or unsubstituted, aryl group or alkenyl group, $R^2$ is a substituted or unsubstituted, aryl group, alkenyl group or alkyl group, or —$CY_3$, where Y is a chlorine atom or a bromine atom.

Typical examples included, but are not restricted to:

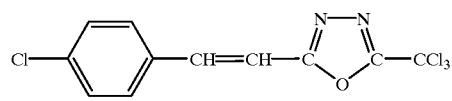
(PAG1-1)

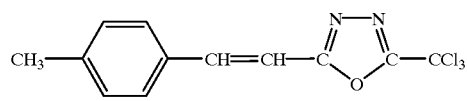
(PAG1-2)

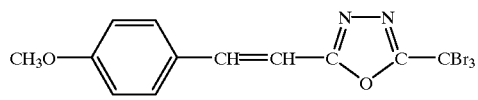
(PAG1-3)

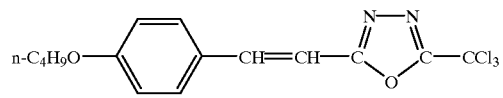
(PAG1-4)

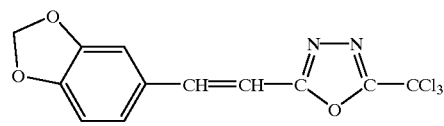
(PAG1-5)

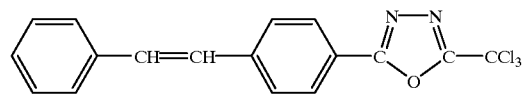
(PAG1-6)

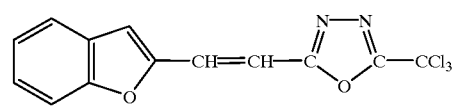
(PAG1-7)

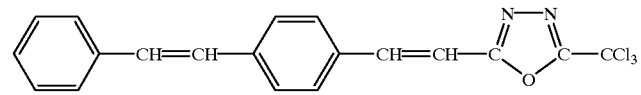
(PAG1-8)

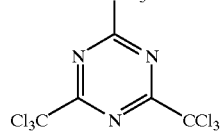
(PAG2-1)

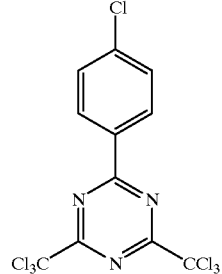
(PAG2-2)

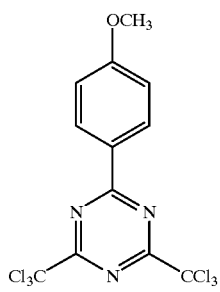
(PAG2-3)
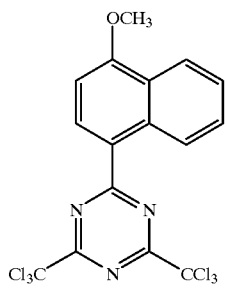
(PAG2-5)
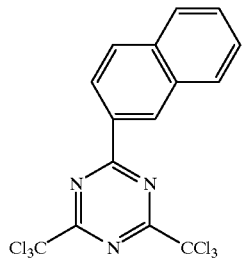
(PAG2-7)
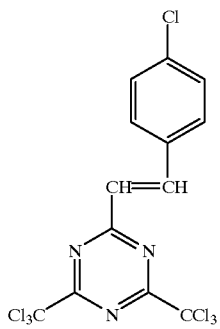
(PAG2-9)
(2) Iodonium salts represented by formula (PAG3) and solufonium salt represented by formula (PAG4)
(PAG3)
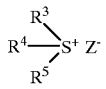
(PAG4)
wherein $Ar^1$ and $Ar^2$ each independently are a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group, and a halogen atom.

$R^3$, $R^4$, and $R^5$ each independently are a substituted or unsubstituted, alkyl group or aryl group, and preferably an aryl group having 6 to 14 carbon atoms, an alkyl group having 1 to 8 carbon atoms or a substituted derivative thereof. Preferred examples of the substitutent which the aryl group can be substituted with include an alkoxy group having 1 to 8 carbon atoms, an alkyl group having 1 to 8 carbon atoms, a nitro group, a carboxyl group, a hydroxy group and a halogen atom, and preferred examples of the substitutent which the alkyl group can be substituted with include an alkoxy group having 1 to 8 carbon atoms, a carboxyl group and an alkoxycarbonyl group.

$Z^-$ represents an anion, and examples thereof include, but are not restricted to, $BF_4^-$, $AsF_6^-$, $PF_6^-$, $SbF_6^-$, $SiF_6^{2-}$, $ClO_4^-$, perfluoroalkane sulfonic anions such as $CF_3SO_3^-$, pentafluorobenzene sulfonic anion, condensed polynuclear aromatic sulfonic anions such as naphthalene-1-sulfonic anion, anthraquinone sulfonic anion, sulfonic acid group-containing dyestuffs, etc.

Two of $R^3$, $R^4$ and $R^5$, and $Ar^1$ and $Ar^2$ are independently may be bonded via a single bond or a substituent.

Typical examples include but are not restricted to:

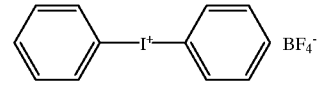
(PAG3-1)

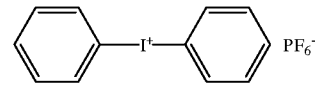
(PAG3-2)

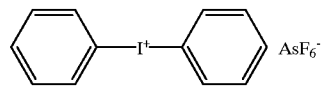
(PAG3-3)

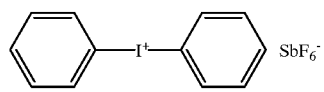
(PAG3-4)

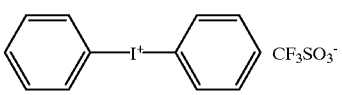
(PAG3-5)

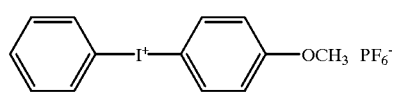
(PAG3-6)

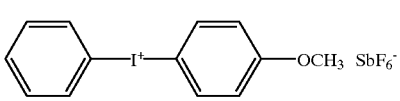
(PAG3-7)

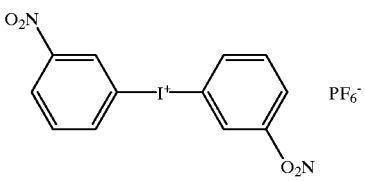
(PAG3-8)

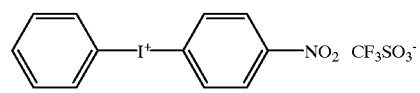
(PAG3-9)

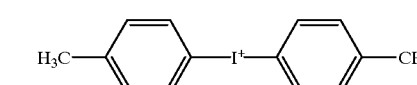
(PAG3-10)

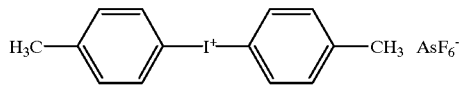
(PAG3-11)

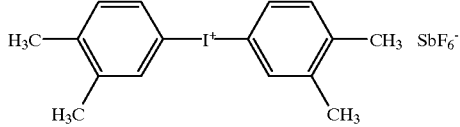
(PAG3-12)

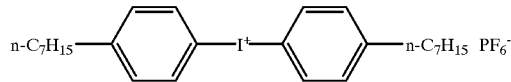
(PAG3-13)

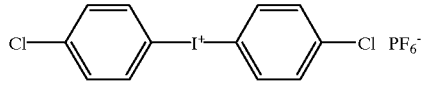
(PAG3-14)

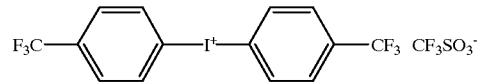
(PAG3-15)

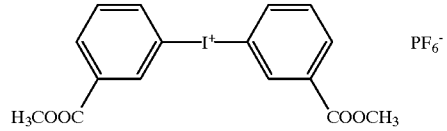
(PAG3-16)

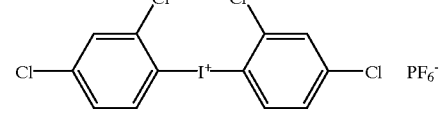
(PAG3-17)

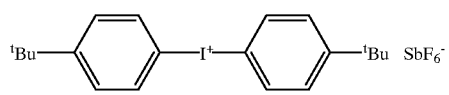
(PAG3-18)

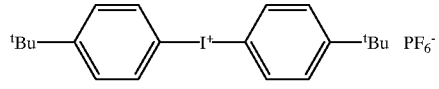

-continued
(PAG3-19)
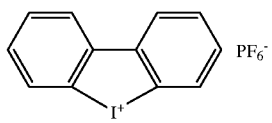
(PAG3-20)
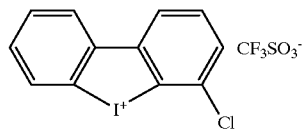
(PAG3-21)
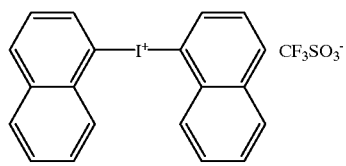
(PAG3-22)
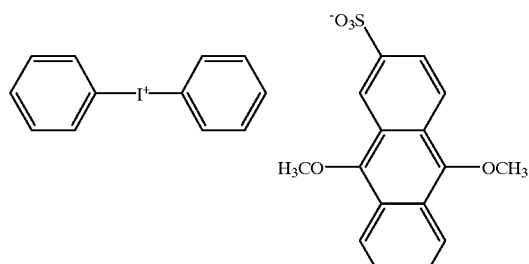
(PAG3-23)
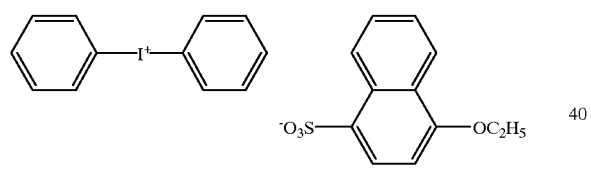
(PAG3-24)
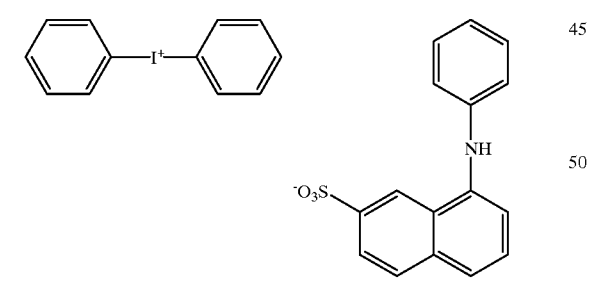
(PAG3-25)
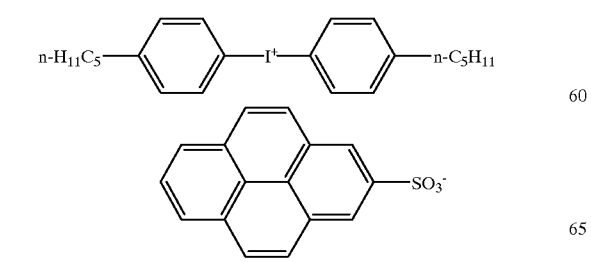
-continued
(PAG3-26)
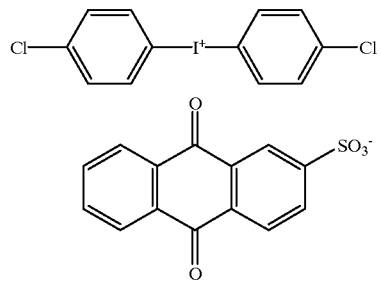
(PAG3-27)
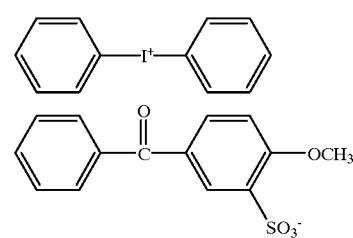
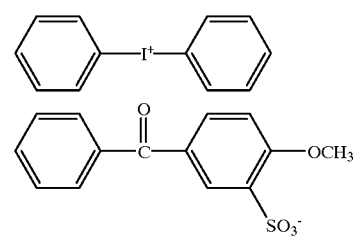
(PAG4-1)
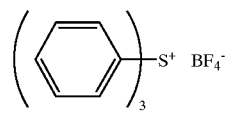
(PAG4-2)
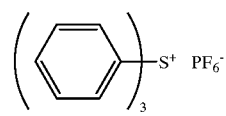
(PAG4-3)
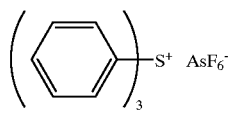
(PAG4-4)
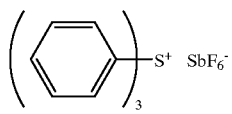
(PAG4-5)
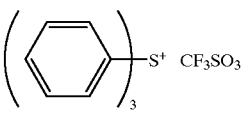
(PAG4-6)
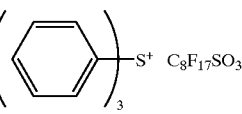
(PAG4-7)
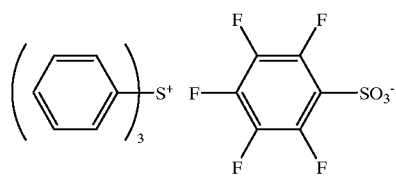

(PAG4-8)
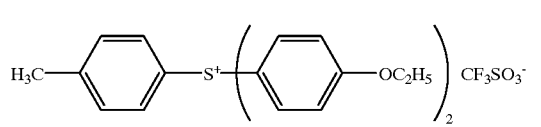
(PAG4-9)
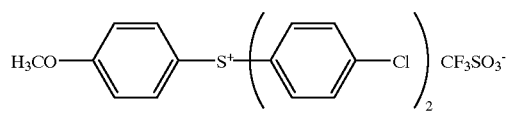
(PAG4-10)
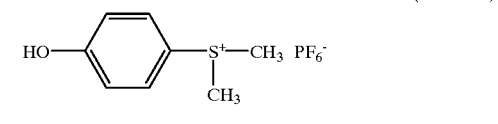
(PAG4-11)
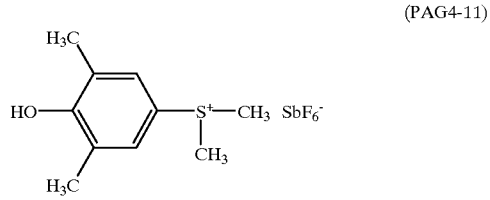
(PAG4-12)
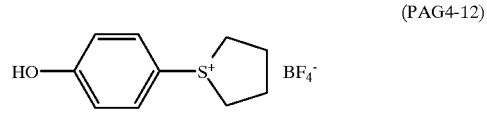
(PAG4-13)
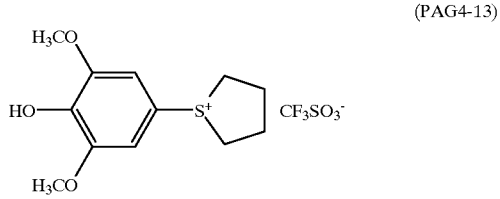
(PAG4-14)
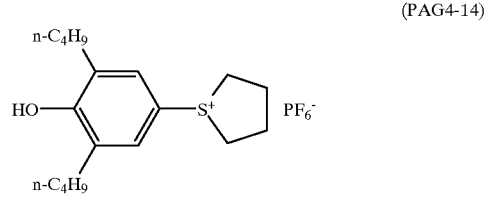
(PAG4-15)
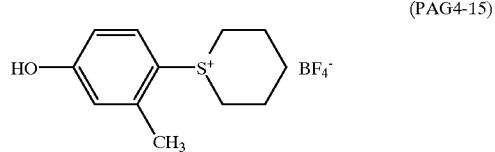
(PAG4-16)
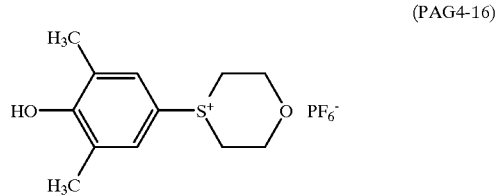
(PAG4-17)
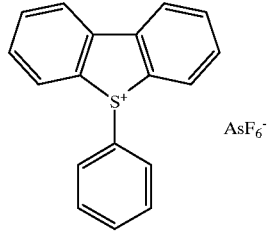
(PAG4-18)
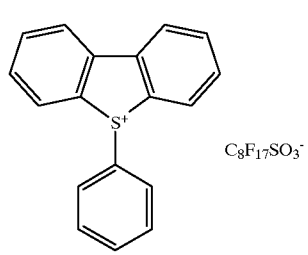
(PAG4-19)
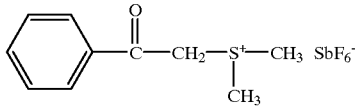
(PAG4-20)
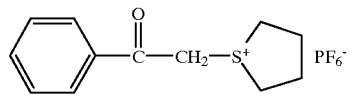
(PAG4-21)
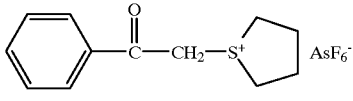
(PAG4-22)
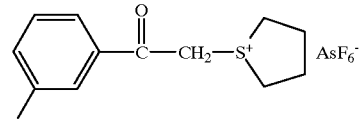
(PAG4-23)
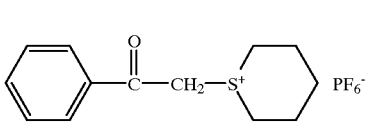
(PAG4-24)
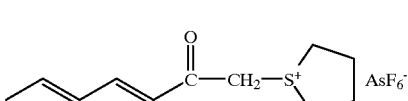
(PAG4-25)
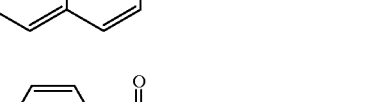
(PAG4-26)
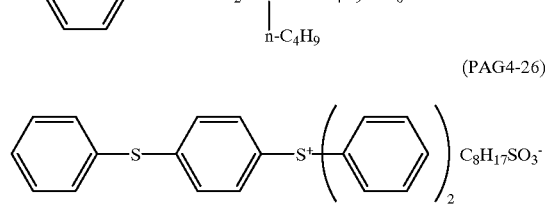

(PAG4-27)
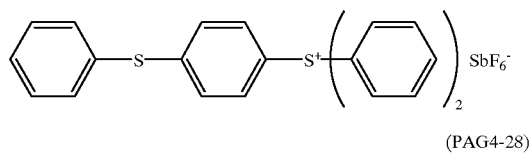

(PAG4-28)
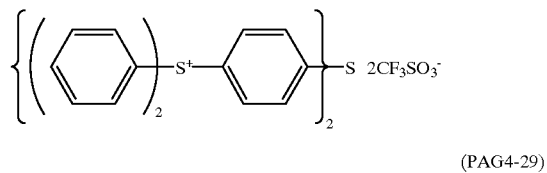

(PAG4-29)
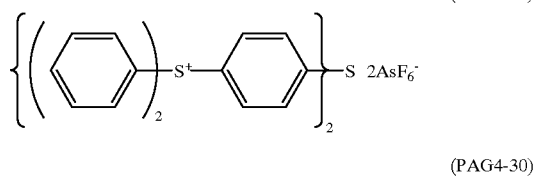

(PAG4-30)
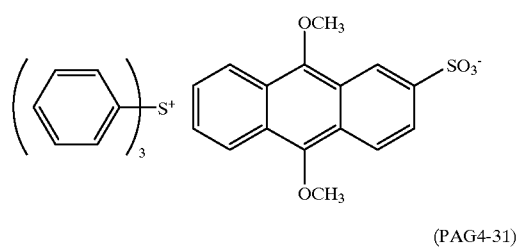

(PAG4-31)
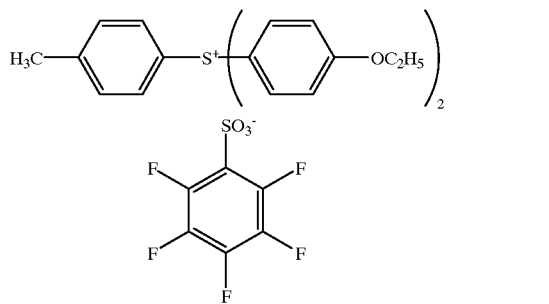

(PAG4-32)
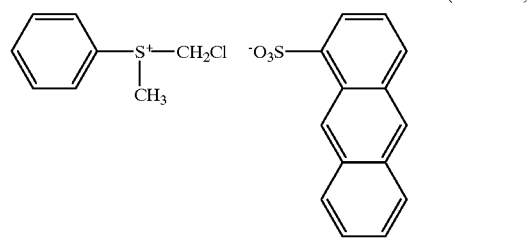

(PAG4-33)

(PAG4-34)
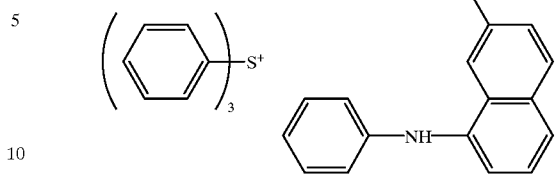

The above-mentioned onium salts represented by formulae (PAG3) and (PAG4) are known and can be synthesized, for example, by a method described in J. W. Knapczyl et al., J. Am. Chem. Soc., 91, 145 (1969), A. L. Maycok et al., J. Org. Chem., 35, 2532, (1970), E. Goethas et al., Bull. Soc. Chem. Belg., 73, 546, (1964), H. M. Leicester, J. Am. Chem. Soc., 51, 3587 (1929), J. V. Crivello et al., J. Polym. Chem. Ed., 18, 2677 (1980), U.S. Pat. Nos. 2,807,648 and 4,247,473, JP-A-53-101,331, etc.

(3) Disulfonic acid derivative represented by formula (PAG5) and iminosulfonate derivative represented by formula (PAG6)

(PAG5)
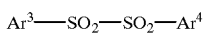

(PAG6)
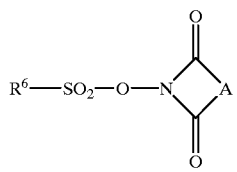

wherein $Ar^3$ and $Ar^4$ are independently a substituted or unsubstituted aryl group, $R^6$ is a substituted or unsubstituted, alkyl group or aryl group, A is a substituted or unsubstituted, alkylene group, alkenylene group or arylene group.

Typical examples include, but are not restricted to:

(PAG5-1)
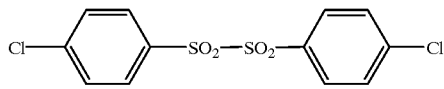

(PAG5-2)
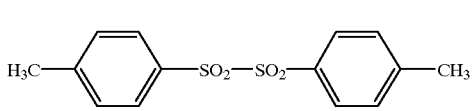

(PAG5-3)
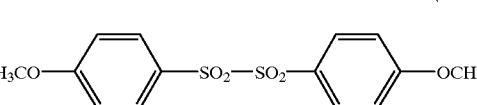

(PAG5-4)
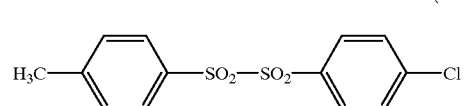

(PAG5-5)
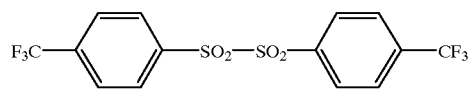
(PAG5-6)
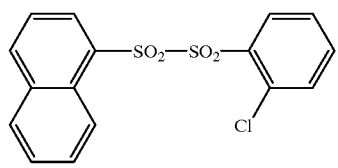
(PAG5-7)
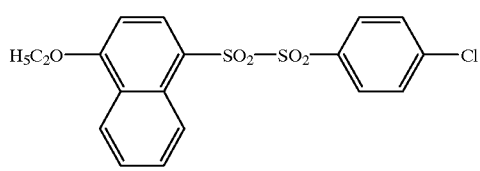
(PAG5-8)
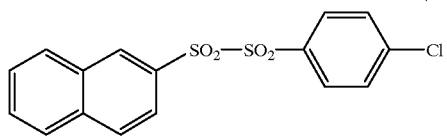
(PAG5-9)
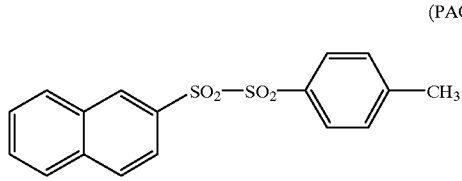
(PAG5-10)
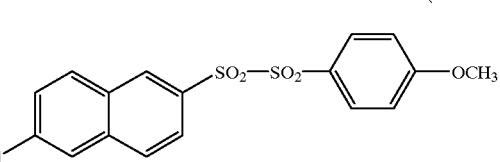
(PAG5-11)
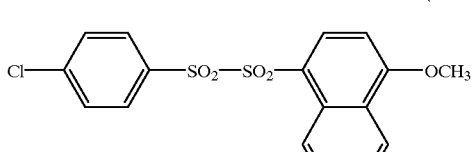
(PAG5-12)
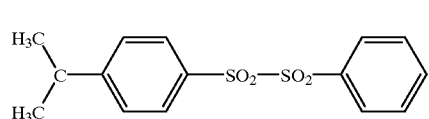
(PAG5-13)
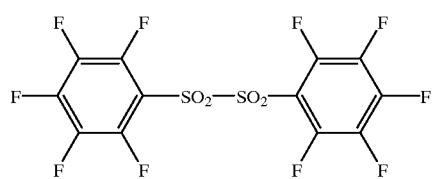
(PAG6-1)
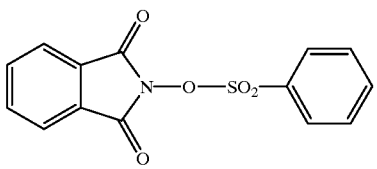
(PAG6-2)
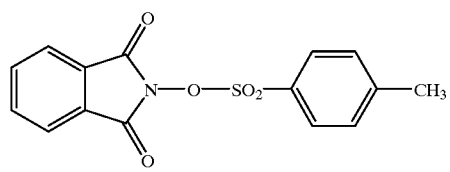
(PAG6-3)
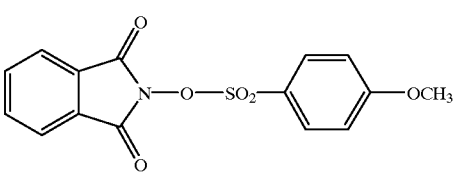
(PAG6-4)
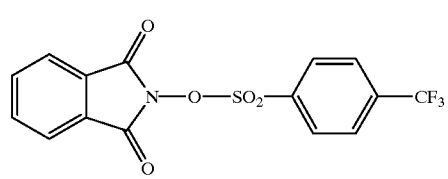
(PAG6-5)
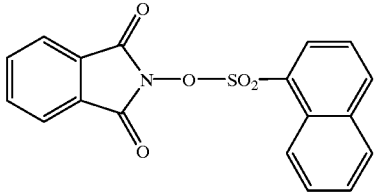
(PAG6-6)
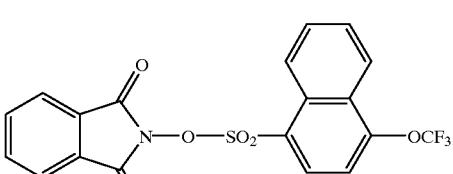
(PAG6-7)
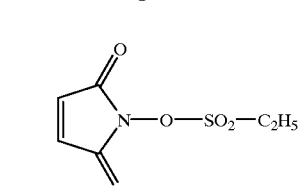
(PAG6-8)
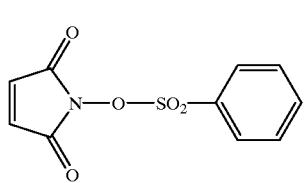

-continued (PAG6-9)
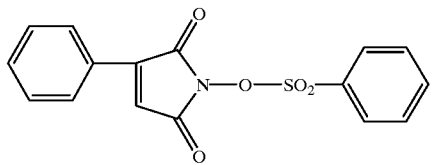

(PAG6-10)
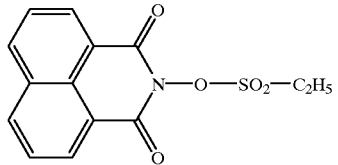

(PAG6-11)
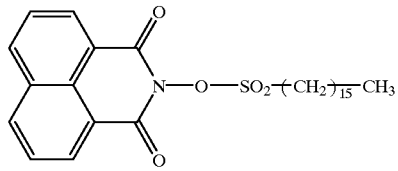

(PAG6-12)
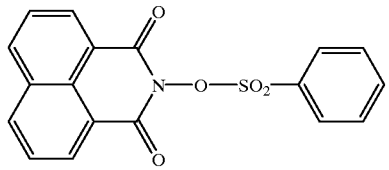

(PAG6-13)
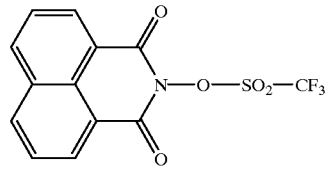

(PAG6-14)
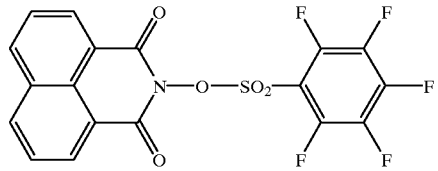

(PAG6-15)
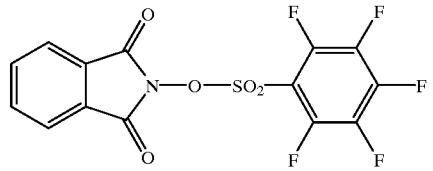

The content of the compound which generates an acid by decomposing upon irradiation with an active ray or radiation is generally from 0.01 to 20% by weight, preferably from 0.1 to 10% by weight, more preferably from 1 to 5% by weight, based on the total weight of the photosensitive composition (excluding a coating solvent).

Next, the resin insoluble in water but soluble in an aqueous alkali solution (hereinafter referred to as an alkali-soluble resin), which can be preferably used in combination with Resin X, is illustrated below. The addition of such an alkali-soluble resin to the photosensitive composition of the present invention is advantageous, because it can heighten the heat resistance and the sensitivity of a resist film formed from the resulting composition and enables the enhancement and adjustment of alkali solubility of the resist film upon development.

Examples of the alkali-soluble resin which can be used in the present invention include a novolak resin, a hydrogenated novolak resin, an acetone-pyrogallol resin, a poly(o-hydroxystyrene), a poly(m-hydroxystyrene), a poly(p-hydroxystyrene), a hydrogenated polyhydroxystyrene, a halogen-or alkyl-substituted polyhydroxystyrene, a hydroxystyrene-N-substituted maleimide copolymer, o/p- and m/p-hydroxystyrene copolymers, polyhydroxystyrenes whose OH groups are partially alkylated (e.g., a polyhydroxystyrene whose OH groups are methylated in a proportion of 5–30 mol %, a polyhydroxystyrene whose OH groups are (1-methoxy)ethylated in a proportion of 5–30 mol %, a polyhydroxystyrene whose OH groups are (1-ethoxy)ethylated in a proportion of 5–30 mol %, a polyhydroxystyrene whose OH groups are 2-tetrahydropyranylated in a proportion of 5–30 mol %, a polyhydroxystyrene whose OH groups are (t-butoxycarbonyl)methylated in a proportion of 5–30 mol %), polyhydroxystyrenes whose OH groups are partially acylated (e.g., a polyhydroxystyrene whose OH groups are acetylated in a proportion of 5–30 mol %, a polyhydroxystyrene whose OH groups are (t-butoxy) carbonylated), a styrene-maleic anhydride copolymer, a styrene-hydroxystyrene copolymer, an α-methylstyrene-hydroxystyrene copolymer, a carboxyl group-containing methacrylic resins and derivatives thereof, but these examples should not be construed as limiting on the scope of the present invention in any way.

Of those alkali-soluble resins, a novolak resin, a poly(o-hydroxystyrene), a poly(m-hydroxystyrene), a poly(p-hydroxystyrene), a copolymer of two or more of these hydroxystyrenes, an alkyl-substituted polyhydroxystyrene, a partially O-alkylated or O-acylated polyhydroxystyrene, a styrene-hydroxystyrene copolymer and an α-methylstyrene-hydroxystyrene copolymer are preferred in particular. The novolak resin as cited above can be obtained using specified monomers as main component and subjecting them to the addition condensation reaction with aldehydes in the presence of an acidic catalyst.

As for the specified monomers, aromatic hydroxy compounds, such as phenol, cresols (e.g., m-cresol, p-cresol and o-cresol), xylenols (e.g., 2,5-xylenol, 3,5-xylenol, 3,4-xylenol and 2,3-xylenol), alkylphenols (e.g., m-ethylphenol, p-ethylphenol, o-ethylphenol, p-t-butylphenol, p-octylphenol and 2,3,5-trimethylphenol), alkoxyphenols (e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol), bisalkylphenols (e.g., 2-methyl-4-isopropylphenol), m-chlorophenol, p-chlorophenol, o-chlorophenol, dihydroxybiphenyl, bisphenol A, phenylphenol, resorcinol and naphthol, can be employed alone or as a mixture of two or more thereof. However, these examples should not be considered as limiting on the scope of the invention.

Specific examples of aldehydes which can be used include formaldehyde, paraformaldehyde, acetaldehyde, propionaldehyde, benzaldehyde, phenylacetaldehyde, α-phenylpropyl aldehyde, β-phenylpropyl aldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde and acetal compounds thereof, such as chloroacetaldehyde diethylacetal. Of these aldehydes, formaldehyde is used to particular advantage.

Those aldehydes can be used alone or as a mixture of two or more thereof. As for the acidic catalyst which can be used, hydrochloric acid, sulfuric acid, formic acid, acetic acid and oxalic acid are examples thereof.

It is desirable for the novolak resins obtained in the foregoing manner to have their weight average molecular weight in the range of 1,000 to 30,000. When the weight average inolecular weight is below 1,000, a decrease of film thickness due to development is too great in the unexposed area; while, when it is increased beyond 30,000, the development speed becomes low. In particular, the range of 2,000 to 20,000 is desirable for the weight average molecular weight of the novolak resin used.

As for the alkali-soluble resins other than novolak resins, such as polyhydroxystyrenes, the derivatives thereof and hydroxystyrene copolymers, it is desirable f or their weight average molecular weight to be at least 2,000, preferably from 5,000 to 200,000, more preferably from 10,000 to 100,000. From the viewpoint of heightening heat resistance of a resist film, it is advantageous to such a resin to have a weight average molecular weight of at least 25,000.

Additionally, the weight average molecular weight is defined as the value determined by gel permeation chromatography on a polystyrene basis.

The alkali-soluble resins as recited above may be used as a mixture of two or more thereof. The proportion of an alkali-soluble resin used is from 10 to 50% by weight, preferably from 20 to 40% by weight, based on the total weight of the photosensitive composition (except a coating solvent).

Acid-decomposable dissolution inhibitive compounds which can be preferably used in the present invention are illustrated below. The use of an acid-decomposable dissolution inhibitive compound is desirable since it can bring about a reduction in film shrinkage due to heating after exposure and enhancement of the capability to inhibit dissolution in an unexposed area, that is to say, improvement in dissolution discrimination between exposed and unexposed areas.

The acid-decomposable dissolution inhibitive compounds used in the present invention are compounds having such a structure that at least two acid-decomposable groups are present and at least 8 bonding atoms, except the atoms contained in the acid-decomposable groups, lie between the two acid-decomposable groups located most remotely from each other.

In particular, it is desirable for the acid-decomposable dissolution inhibitive compound that at least two acid-decomposable groups be present and at least 10 bonding atoms, preferably at least 11 bonding atoms, more preferably at least 12 bonding atoms, except the atoms contained in the acid-decomposable groups, lie between the two acid-decomposable groups located most remotely from each other; or at least three acid-decomposable groups be present and at least 9 bonding atoms, preferably at least 10 bonding atoms, more preferably at least 11 bonding atoms, except the atoms contained in the acid-decomposable groups, lie between the two acid-decomposable groups located most remotely from each other. Further, the upper limit of the number of the aforesaid bonding atoms is preferably 50, more preferably 30.

When an acid-decomposable dissolution inhibitive compound has at least 3, preferably at least 4, acid-decomposable groups, even when it has two acid-decomposable groups, its ability to inhibit the dissolution of an alkali-soluble resin is remarkably enhanced by locating those acid-decomposable groups at a certain definite distance or longer.

Additionally, the distance between acid-decomposable groups in the present invention is expressed in terms of the number of bonding atoms via which one acid-decomposable group is connected to the other acid-decomposable group. For instance, the distance between acid-decomposable groups in each of the following Compounds (1) and (2) is represented by 4 bonding atoms; while that in the following Compound (3) is represented by 12 bonding atoms:

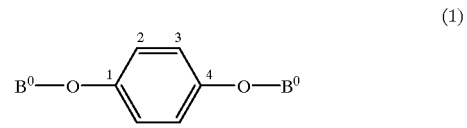

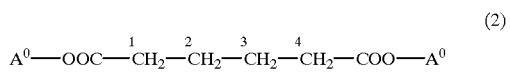

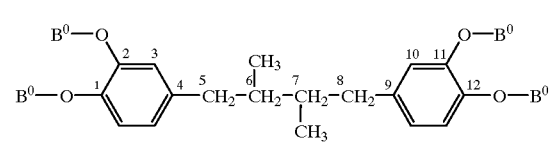

Acid-decomposable groups: $-COO-A^0$, $-O-B^0$

In addition, the acid-decomposable dissolution inhibitive compounds used in the present invention may have two or more acid-decomposable groups on a benzene ring. However, the present invention prefers compounds having in their respective skeletons a benzene ring or benzene rings on which one acid-decomposable group per ring is present. Further, it is desirable for the acid-decomposable dissolution inhibitive compounds used in the present invention to have molecular weight of no higher than 3,000, preferably from 500 to 3,000, more preferably from 1,000 to 2,500.

In preferred embodiments of the present invention, the acid-decomposable groups, namely the groups containing the moieties $-COO-A^0$ and $-O-B^0$, are groups represented by $-R^0-COO-A^0$ or $-Ar-O-B^0$.

Herein, $A_0$ represents a group of formula $-C(R^{01})(R^{02})(R^{03})$, $-Si(R^{01})(R^{02})(R^{03})$ or $-C(R^{04})(R^{05})-O-R^{06}$; and $B^0$ represents $A^0$ or $-CO-O-A^0$.

$R^{01}$, $R^{02}$, $R^{03}$, $R^{04}$ and $R^{05}$ may be the same or different, and each of them represents a hydrogen atom, an alkyl group, a cycloalkyl group, an alkenyl group or an aryl group; and $R^{06}$ represents an alkyl group or an aryl group; provided that at least two among $R^{01}$, $R^{02}$ and $R^{03}$ are groups other than a hydrogen atom. Further, two among $R^{01}$, $R^{02}$ and $R^{03}$ may combine with each other to complete a ring, and two among $R^{04}$, $R^{05}$ and R06 may also combine with each other to complete a ring. $R^0$ represents an unsubstituted or substituted divalent aliphatic or aromatic hydrocarbon group, and $-Ar-$ represents a monocyclic or polycyclic, unsubstituted or substituted, aromatic group having at least two bonding hands.

Therein, suitable examples of an alkyl group include those containing 1 to 4 carbon atoms, such as a methyl group, an ethyl group, a propyl group, a n-butyl group, a sec-butyl group and a t-butyl group; suitable examples of a cycloalkyl group include those containing 3 to 10 carbon atoms, such as a cyclopropyl group, a cyclobutyl group, a cyclohexyl group and an adamantyl group; suitable examples of an alkenyl group include those containing 2 to 4 carbon atoms, such as a vinyl group, a propenyl group, an allyl group and a butenyl group; and suitable examples of an aromatic group include those containing 6 to 14 carbon atoms, such as a phenyl group, a xylyl group, a toluyl group, a cumenyl group, a naphthyl group and an anthryl group.

As examples of a substituent which the groups as recited above can have, mention may be made of a hydroxy group, halogen atoms (e.g, fluorine, chlorine, bromine, iodine), a nitro group, a cyano group, the alkyl groups as recited above, alkoxy groups (e.g., methoxy, ethoxy, hydroxyethoxy, propoxy, hydroxypropoxy, n-butoxy, isobutoxy, sec-butoxy, t-butoxy), alkoxycarbonyl groups (e.g., methoxycarbonyl, ethoxycarbonyl), aralkyl groups (e.g., benzyl, phenetyl, cumyl), acyl groups (e.g., aralkyloxy, formyl, acetyl, butyryl, benzoyl, cinnamyl, valeryl), acyloxy groups (e.g., butyryloxy), the alkenyl groups as recited above, alkenyloxy groups (e.g., vinyloxy, propenyloxy, allyloxy, butenyloxy), the aryl groups as recited above, aryloxy groups (e.g., phenoxy), and aryloxycarbonyl groups (e.g., benzoyloxy).

Suitable examples of such acid-decomposable groups include a silyl ether group, a cumyl ester group, an acetal group, a tetrahydropyranyl ether group, an enol ether group, an enol ester group, a t-alkyl ether group, a t-alkyl ester group and a t-alkyl carbonate group. Of these groups, a t-alkyl ester group, a t-alkyl carbonate group, a cumyl ester group and a tetrahydropyranyl ether group are preferred over the others.

Examples of an acid-decomposable dissolution inhibitive compound which can be used to advantage include the compounds obtained by combining part or all of phenolic OH groups of polyhydroxy compounds with the groups as recited above, or —$R^0$—COO-$A^0$ or $B^0$ groups to protect the OH groups are examples thereof. As for those polyhydroxy compounds, the compounds described in JP-A-01-289946, JP-A-01-289947, JP-A-02-2560, JP-A-03-128959, JP-A-03-158855, JP-A-03-179353, JP-A-03-191351, JP-A-03-200251, JP-A-03-200252, JP-A-03-200253, JP-A-03-200254, JP-A-03-200255, JP-A-03-259149, JP-A-03-279958, JP-A-03-279959, JP-A-04-1650, JP-A-04-1651, JP-A-04-11260, JP-A-04-12356, JP-A-04-12357, and Japanese Patent Application Nos. 3-33229, 3-230790, 3-320438, 4-25157, 4-52732, 4-103215, 4-104542, 4-107885, 4-107889 and 4-152195 are specific examples thereof.

Of those acid-decomposable dissolution inhibitive compounds, those obtained by using the polyhydroxy compounds described in JP-A-01-289946, JP-A-03-128959, JP-A-03-158855, JP-A-03-179353, JP-A-03-200251, JP-A-03-200252, JP-A-03-200255, JP-A-03-259149, JP-A-03-279958, JP-A-04-1650, JP-A-04-11260, JP-A-04-12356, JP-A-04-12357, and Japanese Patent Application Nos. 4-25157, 4-103215, 4-104542, 4-107885, 4-107889 and 4-152195 are preferred over the others.

More specifically, the compounds illustrated by the following formulae [I] to [XVI] respectively are suitable examples of acid-decomposable dissolution inhibitive compounds.

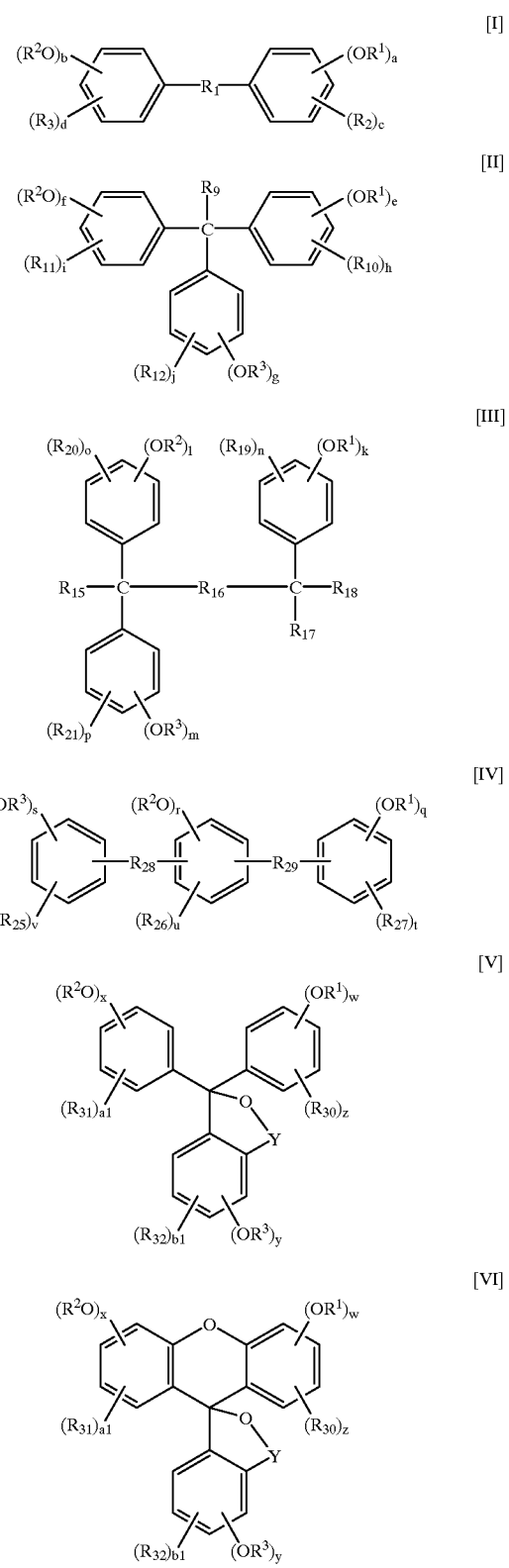

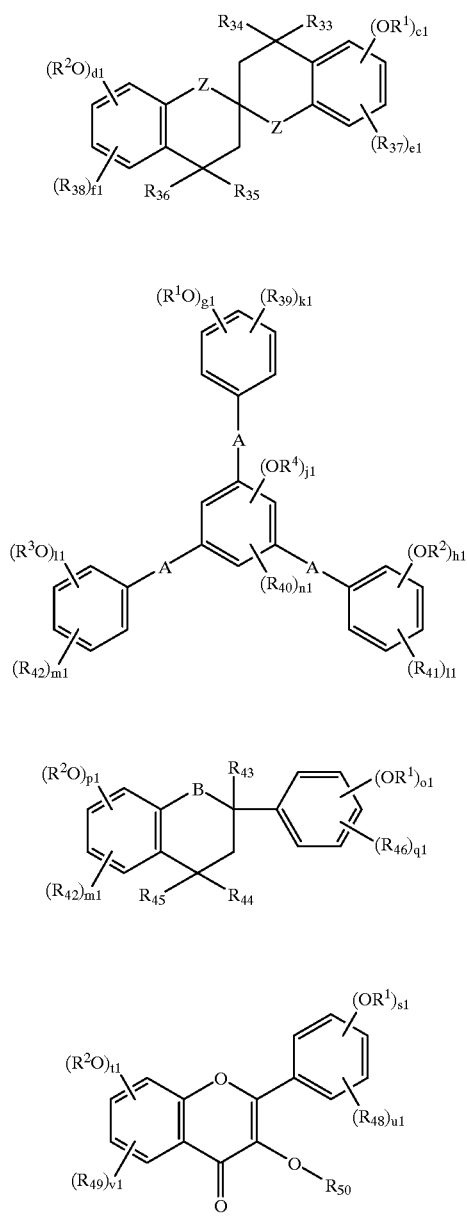

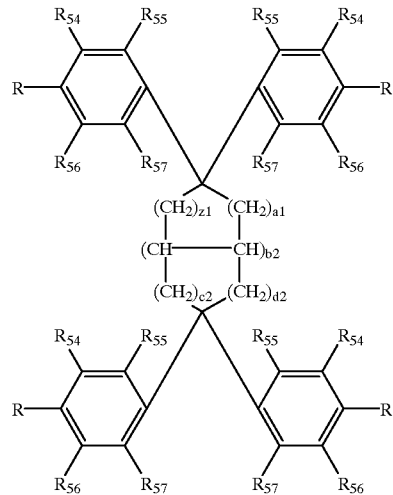

wherein
$R^1$, $R^2$, $R^3$ and $R^4$ may be the same or different and are a hydrogen atom or $-R^0-COO-A^0$ or $B^0$); $R_1$ is $-CO-$, $-COO-$, $-NHCONH-$, $-NHCOO-$, $-O-$, $-S-$, $-SO-$, $-SO_2-$, $-SO_3-$ or

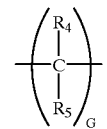

where G=2 to 6, provided that when G=2, at least one of $R_4$ and $R_5$ is an alkyl group;

$R_4$ and $R_5$ may be the same or different and are a hydrogen atom, an alkyl group, an alkoxy group, $-OH$, $-COOH$, $-CN$, a halogen atom, $-R_6-COOR_7$ or $-R_8-OH$, $R_6$ and $R_8$ are independently an alkylene group;

$R_7$ is a hydrogen atom, an alkyl group, an aryl group or an aralkyl group;

$R_2$, $R_3$, $R_9$ to $R_{12}$, $R_{15}$, $R_{17}$ to $R_{21}$, $R_{25}$ to $R_{27}$, $R_{30}$ to $R_{32}$, $R_{37}$ to $R_{42}$, $R_{46}$ to $R_{49}$, and $R_{51}$ may be the same or different and are a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group, or $-N(R_{13})(R_{14})$; where $R_{13}$ and $R_{14}$ are independently a hydrogen atom, an alkyl group or an aryl group;

$R_{16}$ is a single bond, an alkylene group or

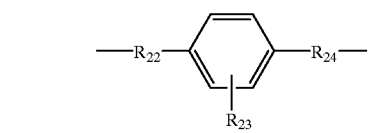

$R_{22}$ and $R_{24}$ may be the same or different and are a single bond, an alkylene group, $-O-$, $-S-$, $-CO-$, or a carboxyl group;

$R_{23}$ is a hydrogen atom, an alkyl group, an alkoxy group, an acyl group, an acyloxy group, an aryl group, a nitro group, a hydroxy group, a cyano group, or a carboxyl group, where the hydroxy group may be substituted with a t-butoxycarbonyl group;

$R_{28}$ and $R_{29}$ may be the same or different and are a methylene group, a lower alkyl-substituted methylene group (the lower alkyl means an alkyl group having 1 to 4 carbon atoms), a halomethylene group, or a haloalkyl group;

$R_{33}$ to $R_{36}$ may be the same or different and are a hydrogen atom or an alkyl group;

$R_{43}$ to $R45$ may be the same or different and are a hydrogen atom, an alkyl group, an alkoxy group, an acyl group, or an acyloxy group;

$R_{50}$ is a hydrogen atom, a t-butoxycarbonyl group or

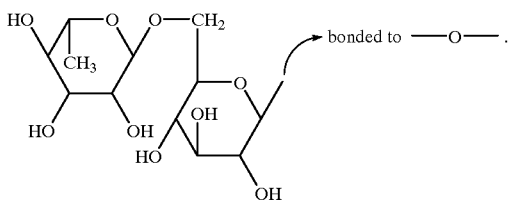

$R_{52}$ and $R_{53}$ may be the same or different and are a hydrogen atom, a lower alkyl group, a lower haloalkyl group or an aryl group;

$R_{54}$ to $R_{57}$ may be the same or different and are a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group or an aryloxycarbonyl group, provided that the four substituents represented by the same symbol may be the same or different;

Y is —CO— or —SO$_2$—;

Z and B are independently a single bond or —O—;

A is a methylene group, a lower alkyl-substituted methylene group, a halomethylene group or a haloalkyl group;

E is a single bond or oxymethylene group;

when a to z, $a_1$ to $y_1$ are two or more, the group in the parentheses may be the same or different;

a to q, s, t, v, $g_1$ to $i_1$, $k_1$ to $m_1$, $o_1$, $q_1$, $s_1$, and $u_1$ are independently 0 or an integer of 1 to 5;

r, u, w, x, y, z, $a_1$ to $f_1$, $p_1$, $r_1$, $t_1$, $v_1$ to $x_1$ are independently 0 or an integer of 1 to 4;

$j_1 n_1, z_1, a_2, b_2, c_2,$ and $d_2$ are independently 0 or an integer of 1 to 3, provided that at least one of $z_1, a_2, c_2,$ and $d_2$ is 1 or more;

$y_1$ is an integer of 3 to 8;

(a+b), (e+f+g), (k+l+m), (q+r+s), (w+x+y), ($c_1$+$d_1$), ($g_1$+$h_1$+$i_1$+$j_1$), ($o_1$+$p_1$), and ($s_1$+$t_1$)≧2;

($j_1$+$n_1$)≦3;

(r+u), (w+z), (x+$a_1$), (y+$b_1$), ($c_1$+$e_1$), ($d_1$+$f_1$), ($p_1$+$r_1$), ($t_1$+$v_1$), and ($x_1$+$w_1$)≦4, provided that in the case of formula [V], (w+z) and (x+$a_1$,) ≦5; and (a+c), (b+d), (e+h), (f+i), (g+j), (k+n), (l+o), (m+p), (q+t), (s+v), ($g_1$+$k_1$), ($h_1$+$l_1$), ($i_1$+$m_1$), ($o_1$+$g_1$), and ($s_1$+$u_1$) ≦5.

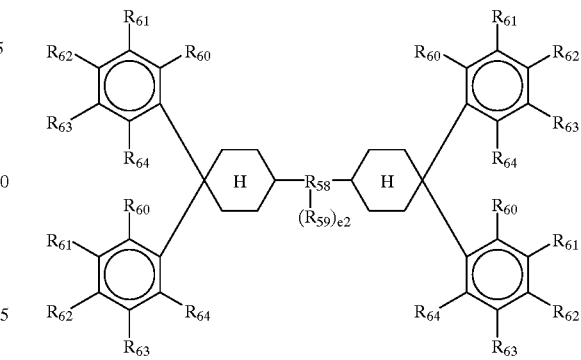

(XIII)

wherein $R_{58}$ is an organic group, a single bond, —S—, —SO—, or

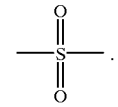

$R_{59}$ is a hydrogen atom, a monovalent organic group or

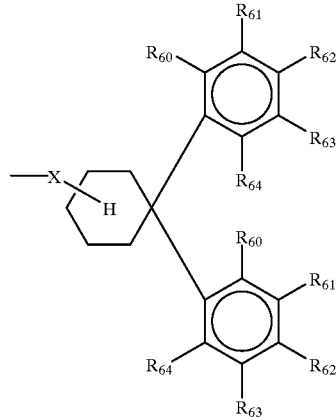

where $R_{60}$ to $R_{64}$ may be the same or different and are a hydrogen atom, a hydroxy group, a halogen atom, an alkyl group, an alkoxy group, an alkenyl group or the group, —O—R$^0$—COO-A$^0$ or —O—B$^0$); provided that at least two of $R_{60}$ to $R_{64}$ are —O—R$^0$—COO—A$^0$ or —O-B$^0$ and each 4 to 6 substituents represented by the same symbol may be the same or different; and X is a divalent organic group; and $e_2$ is 0 or 1.

(XIV)

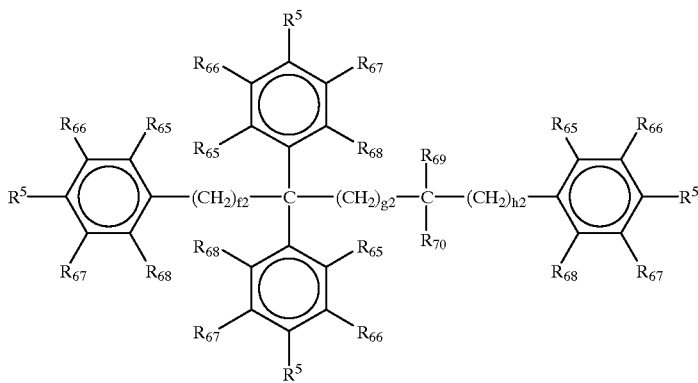

wherein $R_{65}$ to $R_{68}$ may be the same or different and are a hydrogen atom, a hydroxy group, a halogen atom, an alkyl group, an alkoxy group, or an alkenyl group; provided that each 4 to 6 substituents represented by the same symbol may be the same or different;

$R_{69}$ and $R_{70}$ are a hydrogen atom, an alkyl group or

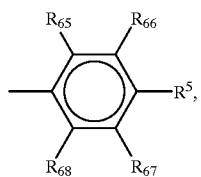

at least two of $R_5$ are the group, —O—R°—COO—A° or —O—B° and the other substituents are a hydroxy group; and $f_2$, $g_2$, and $h_2$ are 0 or an integer of 1 to 5.

(XV)

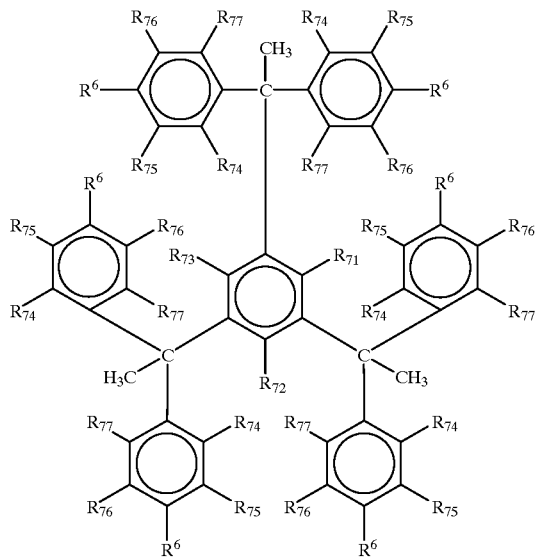

wherein $R_{71}$ to $R_{77}$ may be the same or different, and are a hydrogen atom, a hydroxy group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aryloxy group or an aralkyloxy group; provided that 6 substituents represented by each of $R_{74}$ to $R_{77}$ may be the same or different; and at least two of $R_6$ are the group, —O—R°—COO-A° or —O—B° and the others are a hydroxy group.

(XVI)

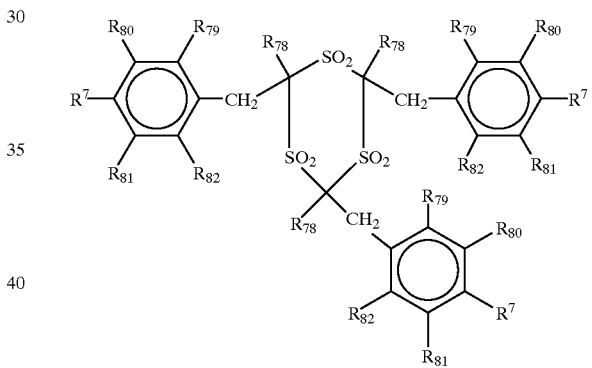

wherein $R_{78}$ is a hydrogen atom or an alkyl group; provided that all the substituents may be the same or different;

$R_{79}$ to $R_{82}$ are a hydrogen atom, a hydroxy group, a halogen atom, an alkyl group or an alkoxy group;

provided that each three substituents represented by the same symbol may be the same or different; and at least two of $R_7$ are the group, —O—R°—COO—A° or —O-B° and the other substituents are a hydroxy group.

Typical examples of preferred compounds will be described.

(1)

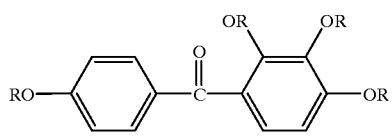

(2) 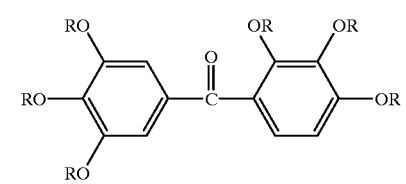
(3) 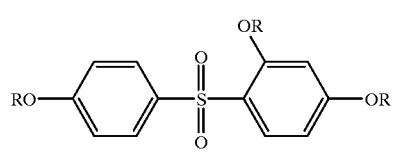
(4) 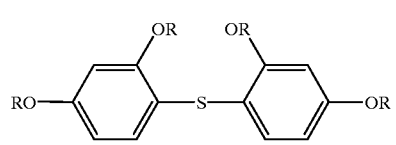
(5) 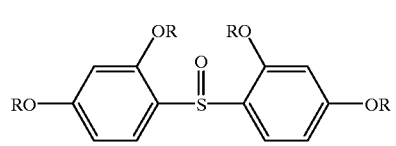
(6) 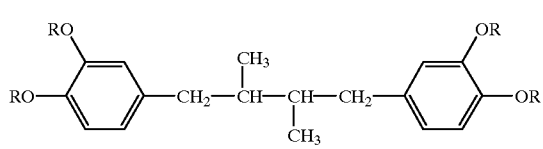
(7) 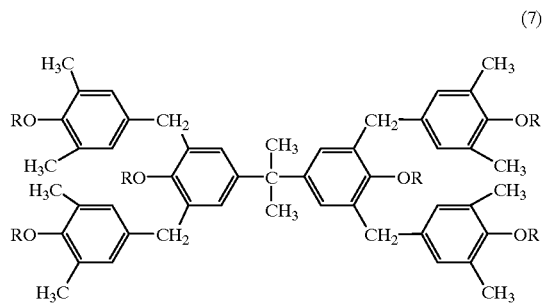
(8) 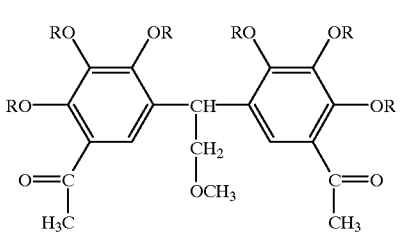
(9) 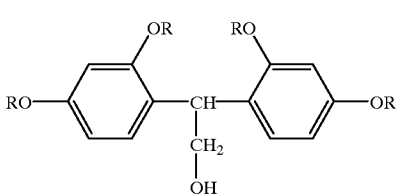
(10) 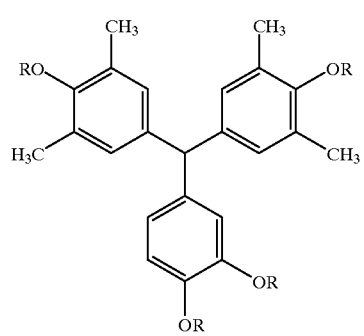
(11) 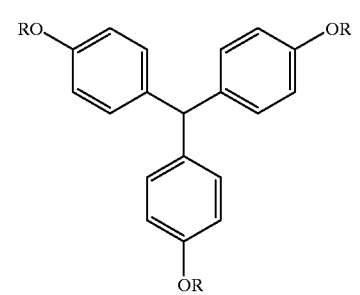
(12) 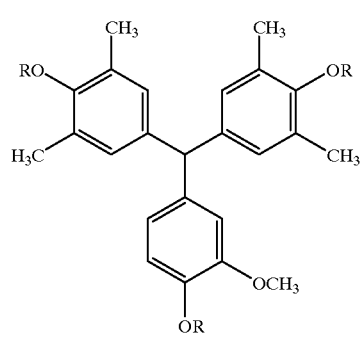
(13) 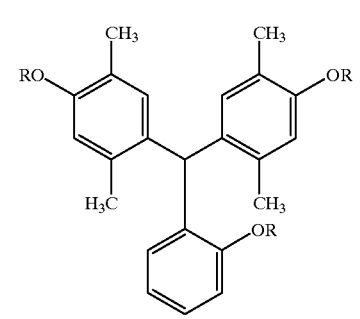
(14) 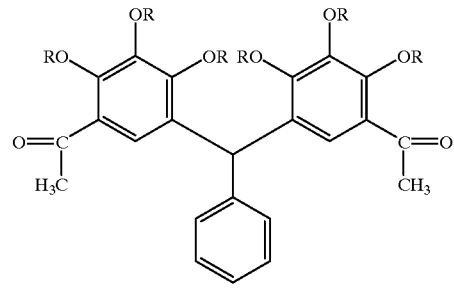

(15)
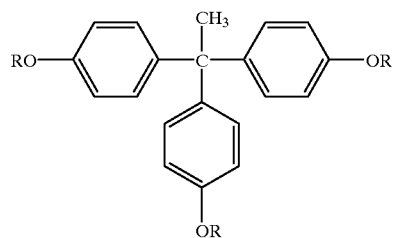
(16)
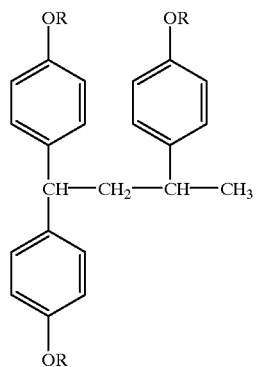
(17)
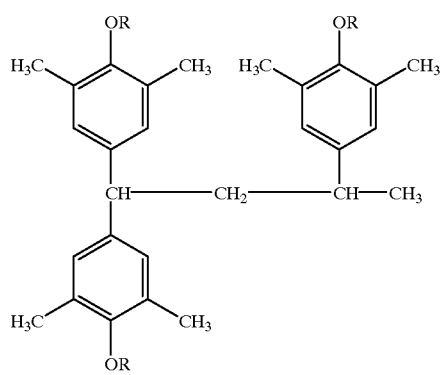
(18)
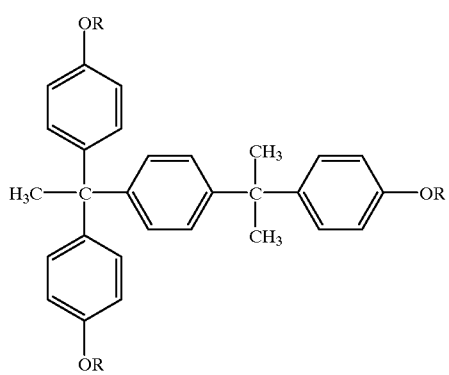
(19)
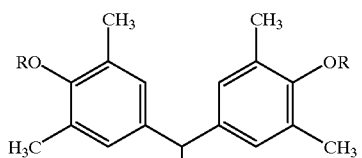
(20)
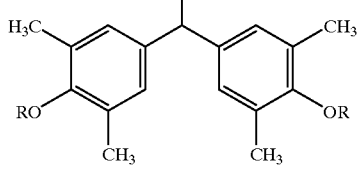
(21)
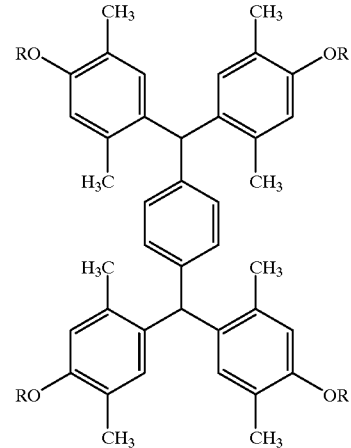
(22)
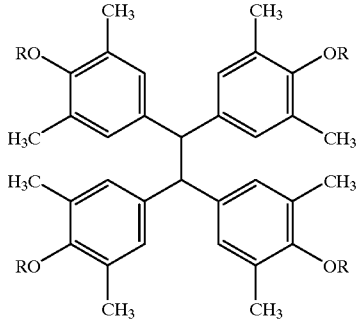

(23)
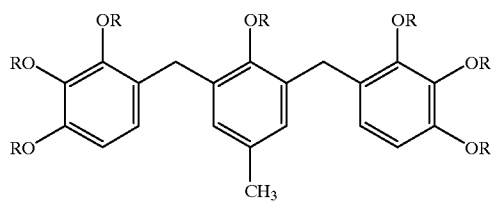
(24)
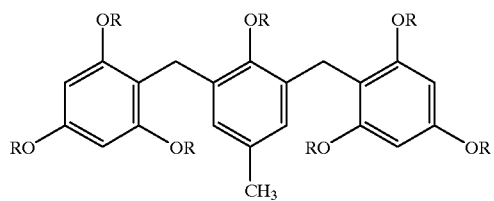
(25)
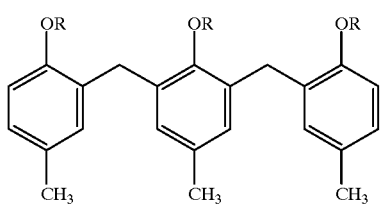
(26)
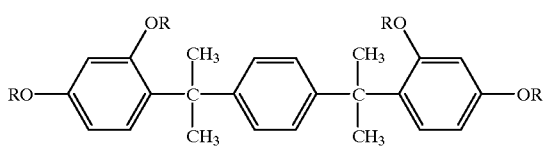
(27)
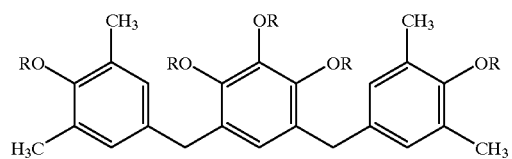
(28)
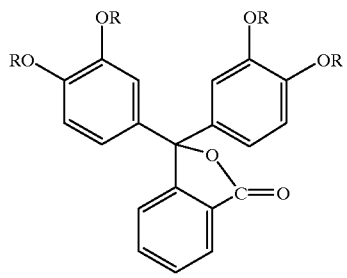
(29)
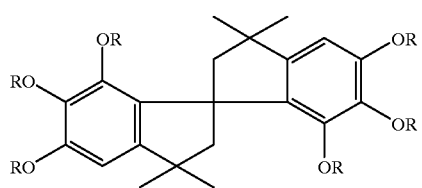
(30)
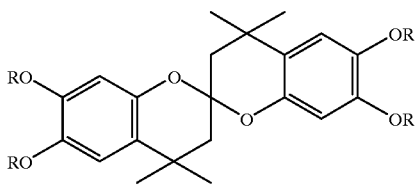
(31)
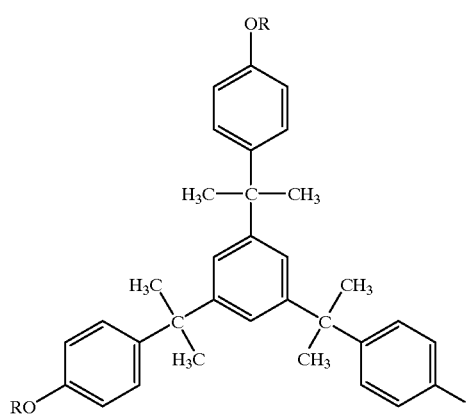
(32)
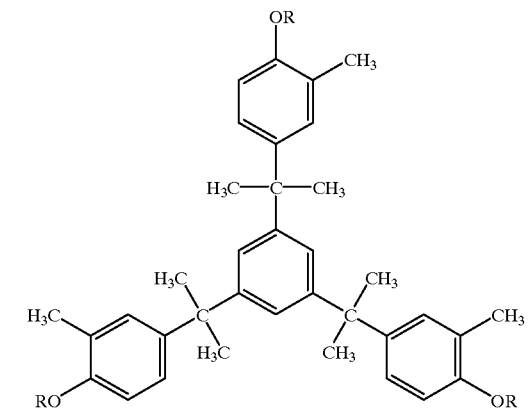
(33)
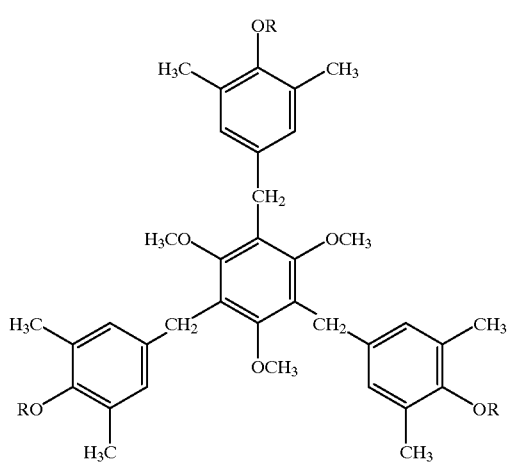

(34)
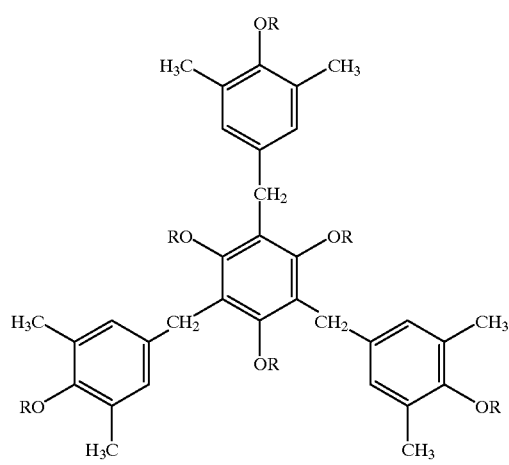
(35)
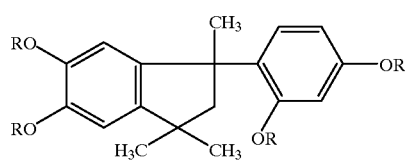
(36)
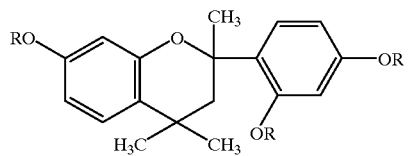
(37)
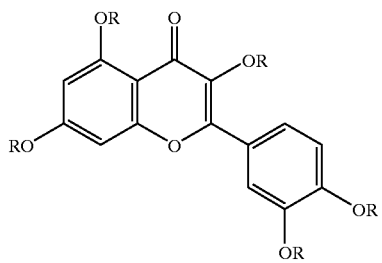
(38)
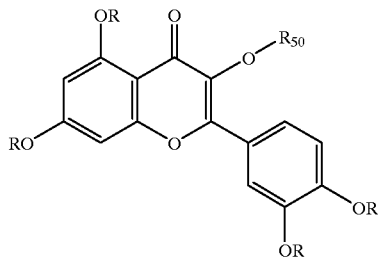
wherein $R_{50}$ is:
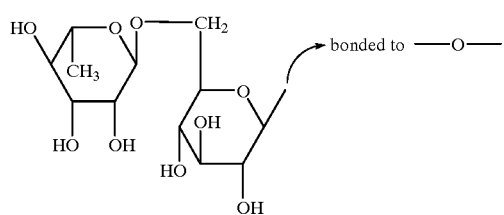
(39)
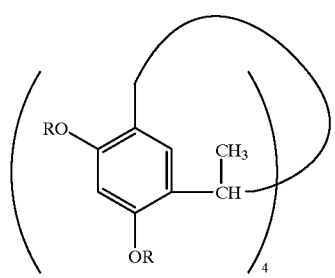
(40)
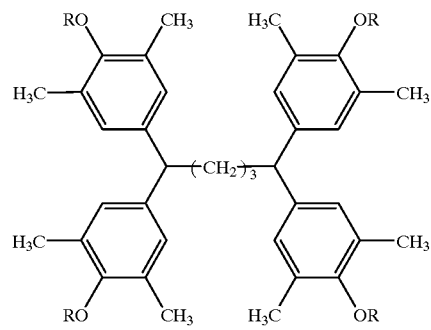
(41)
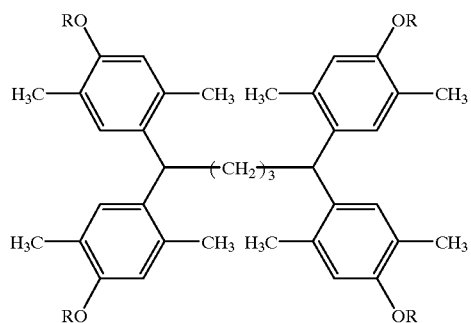
(42)
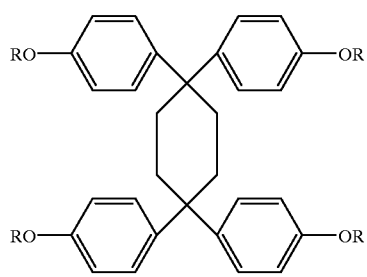
(43)
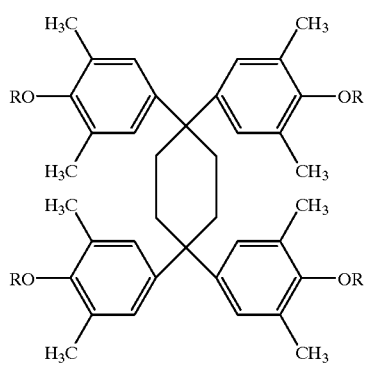

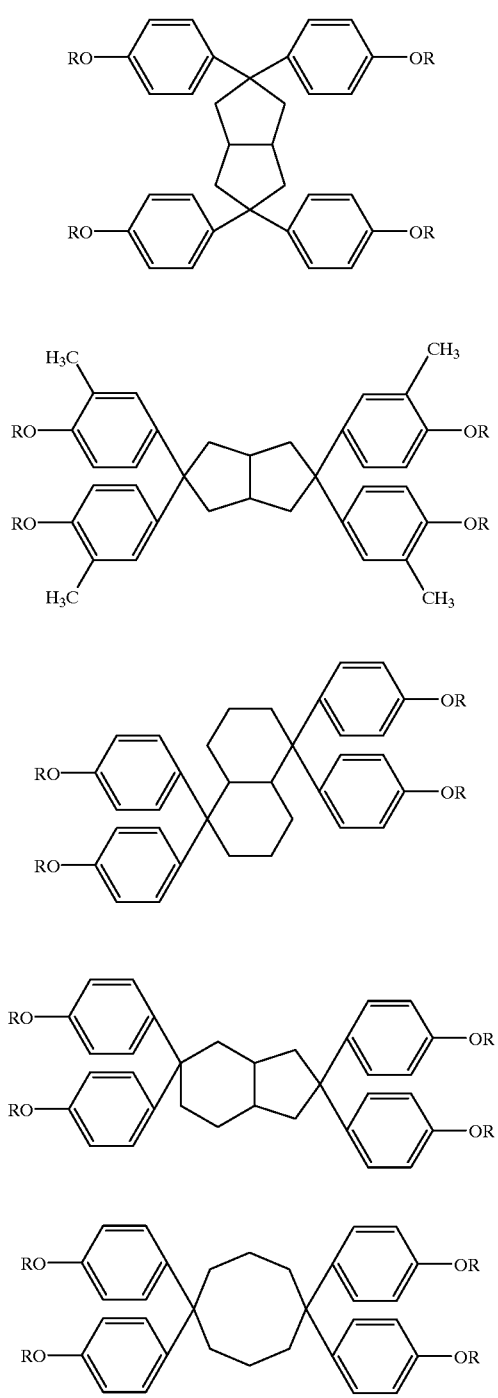
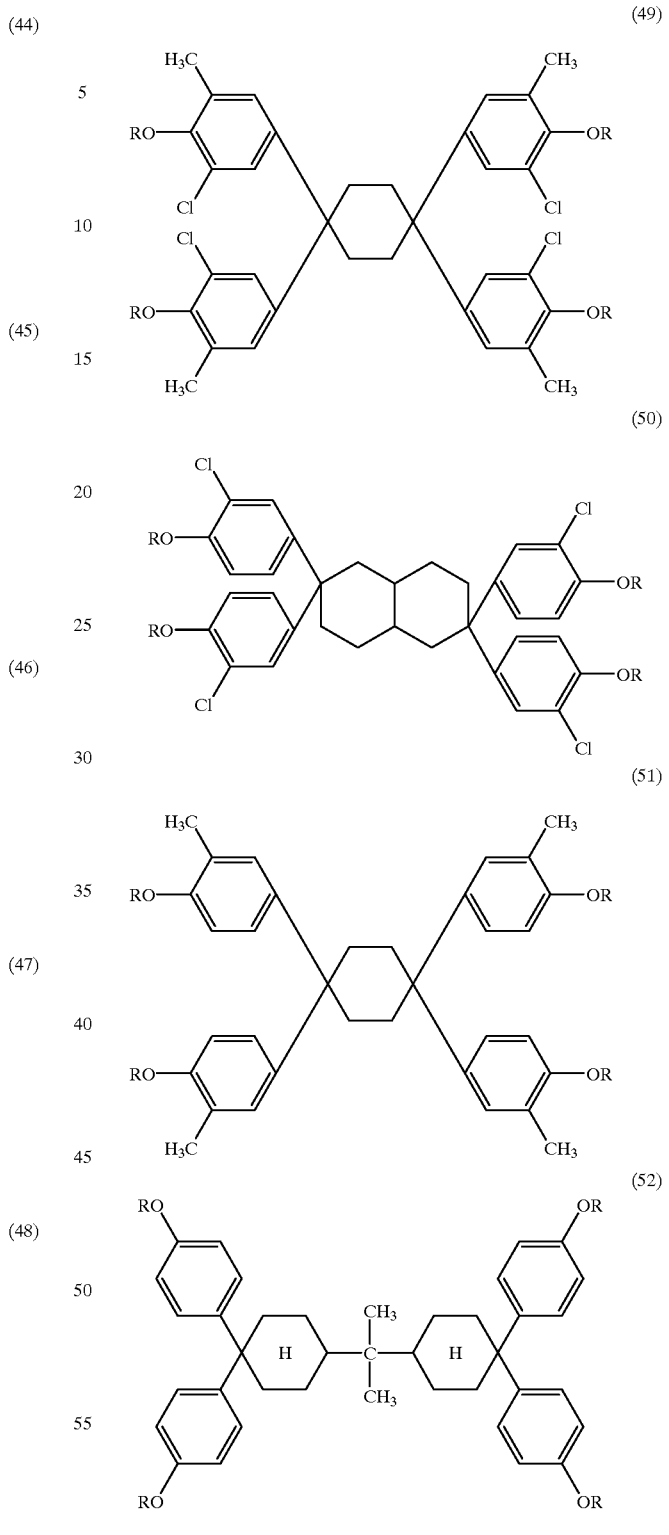

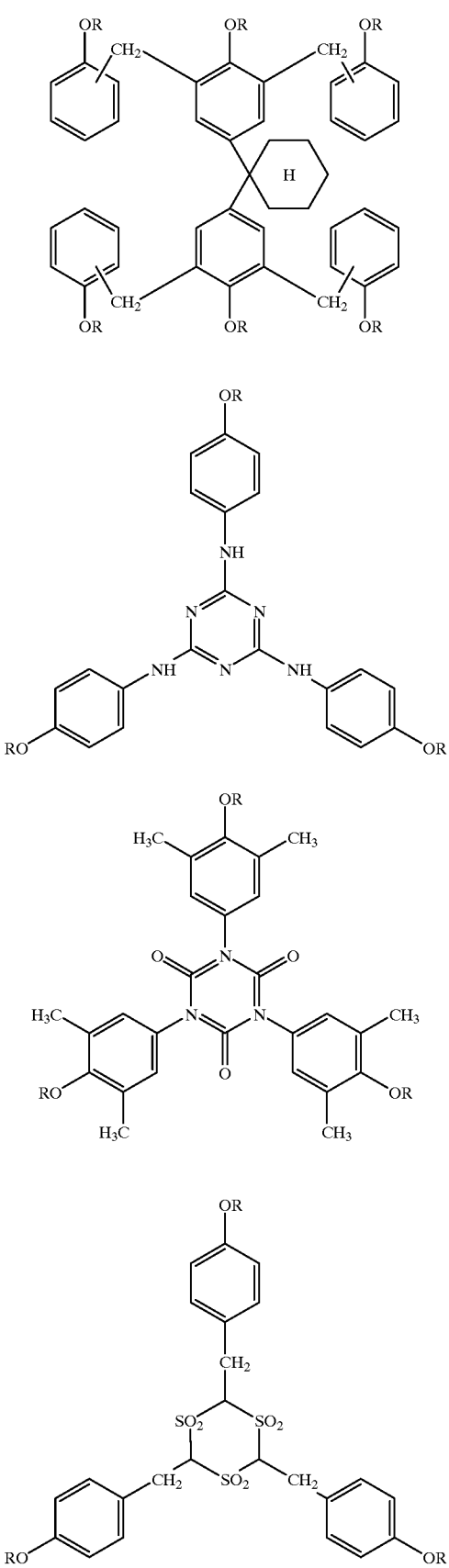

-continued

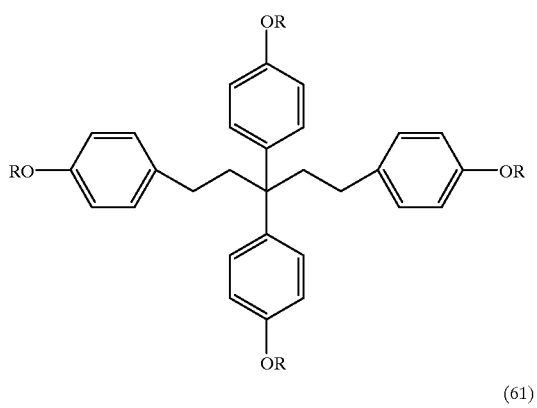

(60)

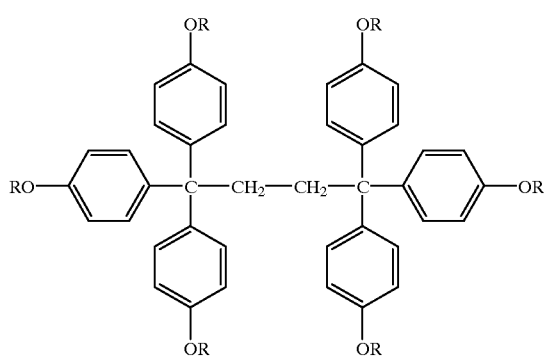

(61)

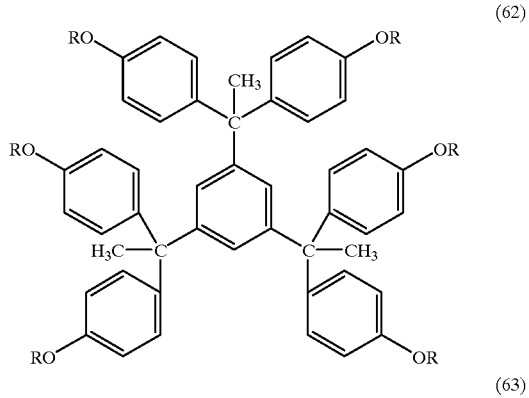

(62)

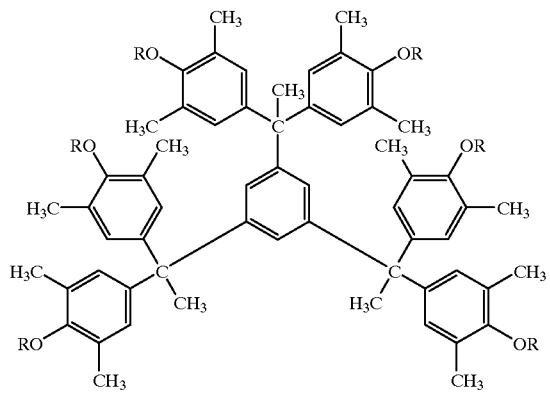

(63)

R groups in each of Compounds (1) to (63) are each a hydrogen atom, —CH$_2$—COO—C (CH$_3$)$_2$C$_6$H$_5$, —CH$_2$—COO—C$_4$H$_9$(t) —COO—C$_4$H$_9$(t) or tetrahydropyrane-2-yl, provided that at least two of the R groups, or three of them depending on the structural condition, are groups other than a hydrogen atom. The substituents represented by R may be the same or different from each other.

The added amount of an acid-decomposable dissolution inhibitive compound is generally from 3 to 50% by weight, preferably from 5 to 35% by weight, more preferably from 10 to 20% by weight, based on the total weight of the photosensitive composition (excluding a solvent).

The present photosensitive composition can further contain a dye, a pigment, a plasticizer, a surfactant, a photosensitizer, an organic basic compound and a compound having at least two phenolic OH groups to promote dissolution in a developer, if needed.

For the compounds having at least two phenolic OH groups which can be used in the present invention, it is desirable to be phenolic compounds having molecular weight of no higher than 1,000. Such phenolic compounds are required to have at least two phenolic OH groups in a molecule, but they lose their effect on improvement in development latitude when the number of phenolic OH groups contained therein is increased beyond 10. Further, when the ratio by number between phenolic OH groups and aromatic ring(s) is less than 0.5 in a phenolic compound, there is a tendency of providing a deteriorated film thickness dependence and decreased development latitude. In addition, it is also undesirable that the foregoing ratio is greater than 1.4, because the photosensitive composition containing such a phenolic compound undergoes deterioration in stability to make it difficult to achieve high resolution and satisfactory film thickness dependence.

With respect to the phenolic compounds suitable for the present invention, it is desirable for them to be added in a proportion of 2 to 50% by weight, preferably 5 to 30% by weight, based on an alkali-soluble resin used together. The addition thereof in a proportion higher than 50% by weight is undesirable because deterioration in development residue and pattern deformation upon development is caused.

Those phenolic compounds, which have molecular weight of not higher than 1,000, can be prepared with ease by reference to the methods described in, e.g., JP-A-04-122938, JP-A-02-28531, U.S. Pat. No. 4,916,210 and European Patent 0,219,294.

Specific examples of such a phenolic compound include the compounds set forth below, but these examples are not to be considered as limiting on the scope of compounds usable in the present invention.

Resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucide, 2,4,2',4'-biphenyltetrol, 4,4'-thiobis(1, 3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl) methane, 1,1-bis(4-hydroxyphenyl)cyclohexane, 4,41-(α-methylbenzylidene)bisphenol, α,α',α''-tris(4-hydroxyphenyl)-1,3,5-triisopropylbenzene, α,α',α''-tris(4-hydroxyphenyl)-1-ethyl-4-isopropylbenzene, 1,2,2-tris (hydroxyphenyl)propane, 1,1,2-tris(3,5-dimethyl-4-hydroxyphenyl)propane, 2,2,5,5-tetrakis(4-hydroxyphenyl) hexane, 1,2-tetrakis(4-hydroxyphenyl)ethane, 1,1,3-tris (hydroxyphenyl)butane and para[α, α, α', α'-tetrakis(4-hydroxyphenyl)]xylene are the aforementioned specific examples.

The organic basic compounds which can be appropriately used in the present invention are compounds having stronger basicity than phenol. Of those compounds, nitrogen-containing basic compounds are used to greater advantage.

As examples of a desirable chemical environment of nitrogen atom(s) in such a basic compound, mention may be made of the structures represented by the following formulae (XVII) to (XXI):

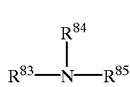

(XVII)

wherein $R^{83}$, $R^{84}$ and $R^{85}$ are identical or different, and each of them represents a hydrogen atom, an alkyl group containing 1 to 6 carbon atoms, an aminoalkyl group containing 1 to 6 carbon atoms,, a hydroxyalkyl group containing 1 to 6 carbon atoms or a substituted or unsubstituted aryl group containing 6 to 20 carbon atoms, or $R^{84}$ and $R^{85}$ may be combined with each other to complete a ring;

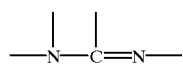

(XVIII)

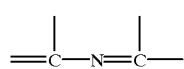

(XIX)

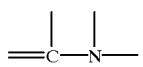

(XX)

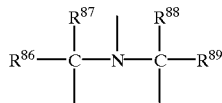

(XXI)

wherein $R^{86}$, $R^{87}$, $R^{88}$ and $R^{89}$, which may be the same or different, each represents an alkyl group containing 1 to 6 carbon atoms.

More appropriate nitrogen-containing basic compounds are those containing in a molecule at least two nitrogen atoms different in chemical environment. In particular, compounds having in a molecule both a substituted or unsubstituted amino group and a ring structure containing nitrogen atom(s) or compounds having alkylamino groups are preferred over others. As examples of an organic basic compound appropriate for the present invention, mention may be made of a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine. As for substituents suitable for the compounds as recited above, an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group are examples thereof. Specifically, favorable basic compounds are guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperadine, N-(2-aminoethyl)piperadine, N-(2-aminoethyl)piperidine, 4-amino-2,2,6,6-tetramethylpiperidine, 4-piperizinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N- (2-aminoethyl)morpholine. However, basic compounds usable in the present invention should not be construed as being limited to the compounds recited above.

Such a nitrogen-containing basic compound can be used alone or as a mixture of two or more thereof. The amount of nitrogen-containing basic compound(s) is generally from 0.001 to 10 parts by weight, preferably from 0.01 to 5 parts by weight, per 100 parts by weight of the photosensitive composition (excluding a solvent). When the addition amount is less than 0.001 part by weight, the addition does not provide sufficient effect; while, when it is more than 10 parts by weight, the addition tends to lower the sensitivity and deteriorate the developability in unexposed areas.

As for suitable dyes, oil colors and basic dyes are examples thereof. Specifically, Oil Yellow #101, Oil Yellow #103, Oil Pink #312, Oil Green BG, Oil Blue BOS, Oil Blue #603, Oil Black BY, Oil Black BS, Oil Black T-505 (which are products of Orient Kagaku Kogyo Co., Ltd.), Crystal Violet (CI42555), Methyl Violet (CI42535), Rhodamine B (CI45170B), Malachite Green (CI42000) and Methylene Blue (CI52015) can be used to advantage.

Further, the spectral sensitizers as recited below are added to induce sensitivity to the wavelengths at which the photoacid generator used has no spectral absorption, that is, wavelengths longer than far ultraviolet region, and thereby it becomes possible to confer the sensitivity to i- or g-ray upon the present photosensitive composition. Specific examples of such a spectral sensitizer include benzophenone, p,p'-tetramethyldiaminobenzophenone, p,p'-tetraethylethylaminobenzo-phenone, 2-chlorothioxanthone, anthrone, 9-ethoxyanthracene, anthracene, pyrene, perylene, phenothiazine, benzil, Acridine Orange, benzoflavin, Cetoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin), and coronene, but these examples should not be construed as limiting on the scope of spectral sensitizers usable in the invention.

In addition, those spectral sensitizers can be used as an absorbent for far ultraviolet rays of a light source. Such absorbents can reduce the reflected light from a substrate to lessen the influence of multiple reflection inside the resist film; as a result, an effect on stationary wave improvement can be produced.

The photosensitive composition of the present invention, the ingredients mentioned above are dissolved in a solvent and coated on a support. Suitable examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethylether acetate, propylene glycol monomethyl ether, propylene glycol monomethylether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents are used alone or as a mixture of two or more thereof.

Also, a surfactant can be added to the solvent as recited above. Specific examples of such a surfactant include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenyl ether, polyoxyethylene nonyl phenyl ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylenesorbitan fatty acid esters (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate), fluorine-containing surfactants, such as Eftop EF301, EF303 and EF352 (commercial names, products of Shin-Akita Kasei K.K.), Megafac F171, F173 and F177 (commercial names, products of Dai-Nippon Ink & Chemicals, Inc.), Florad FC430 and FC431 (commercial names, products of Sumitomo 3M Co., Ltd.), Asahiguard AG710, Surflon S-382, SC101, SC102, SC103, SC104, SC105 and SC106 (commercial names, products of Asahi Glass Company, Ltd.), organosiloxane polymers, such as KP341 (code name of Shin-Etsu Chemical Co., Ltd.), and acrylic or methacrylic acid (co)polymers, such as Polyflow No. 75 and No. 95 (commercial names, products of Kyoeisha Yushi Kagaku Kogyo K.K.). The amount of the surfactant is generally not greater than 2 parts by weight, preferably not greater than 1 part by weight, per 100 parts by weight of the total solids in the composition. The surfactant may be added alone or as a mixture of two or more thereof.

The aforementioned photosensitive composition is coated on a substrate as used for the production of precise integrated circuit elements (e.g., a silicon/silicon dioxide coating) with an appropriate coating means, e.g., a spinner, a coater or so on, exposed to light via a given mask, baked and then developed, thereby providing a satisfactory resist pattern.

The developer usable for the present photosensitive composition is an alkaline aqueous solution containing an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcohol amine such as dimethylethanolamine or triethanolamine, a quaternary ammonium slat such as tetramethylammonium hydroxide or tetraethylammonium hydroxide, or a cyclic amine such as pyrrole or piperidine. To such an alkaline aqueous solution, an alcohol and a surfactant can be added in appropriate amounts.

The present invention will be illustrated below in more detail by the following examples, but the scope of the invention should not be construed as being limited by these examples.

EXAMPLES 1 TO 20 AND COMPARATIVE EXAMPLES 1 TO 4

Synthesis of Exemplary Resin (1)

| | |
|---|---|
| Poly(4-hydroxystyrene) [weight average molecular weight: 11,000, reduced to a polystyrene basis] | 48.1 g (0.400 mol) |
| t-Butyl bromoacetate | 7.80 g (0.0400 mol) |
| Potassium carbonate | 6.1 g (0.0440 mol) |

The above-described ingredients are admixed with 250 ml of DMAc, and this admixture was heated at 120° C. for 7 hours with stirring. After it was cooled by standing, 2.64 g of acetic acid was added thereto, followed by pouring into 3 l of ion-exchanged water with stirring. The powdery precipitate thus obtained was filtered off, washed with ion-exchanged water, and dried at 40° C. under reduced pressure. As a result, 51.2 g of a white resin (Resin (a)) was obtained. The weight average molecular weight of this resin was determined to be 12,100 by GPC (gel permeation chromatography) measurement. By NMR and TGA (thermogravimetric analysis) measurements, this resin was confirmed to have t-butoxycarbonylmethoxy groups substituted for 10% of the OH groups of the starting resin.

A 17.6 g portion of Resin (a) was dissolved in 80 ml of THF. To this solution, 5.0 g (0.050 mol) of t-butyl vinyl ether was added, and further 1.37 g of a solution containing 90 mg of p-toluenesulfonic acid in 100 g of THF was added as a catalyst, followed by 24-hour stirring at room temperature. The resulting reaction mixture was passed through a basic ion-exchange resin column to remove the catalyst, and then poured into 3 l of ion exchanged water with stirring. Thus, 19 g of a white resin was obtained. The weight average molecular weight of this resin was determined to be 13,200 by GPC measurement. By NMR and TGA measurements, this resin was confirmed to be the resin corresponding to the present Compound Example (1) (wherein the total rate of substitution of two kinds of groups for OH groups was 30%).

Synthesis of Exemplary Resin (28)

| | |
|---|---|
| t-Butyl 4-vinylbenzoate | 2.06 g (0.0150 mol) |
| 4-Acetoxystyrene | 21.9 g (0.135 mol) |

The foregoing monomers were dissolved in 80 ml of 1-methoxy-2-propanol, and heated up to 65° C. Thereto, 0.125 g of a polymerization initiator V-65 (code name, a product of Wako Pure Chemical Industries, Ltd.) was added with stirring in a stream of nitrogen. To this reaction solution, a solution containing 4.12 g (0.0300 mol) of t-butyl 4-vinylbenzoate, 43.8 g (0.270 mol) of 4-acetoxystyrene and 0.250 g of V-65 in 160 ml of 1-methoxy-2-propanol was added dropwise over a period of 2 hours. The resulting solution was stirred for 2 hours in a stream of nitrogen, and then 0.125 g of V-65 was further added thereto. Thereafter, the stirring was carried out for 2 hours at 65° C., and further for 1 hour at 90° C. After it was cooled by standing, the reaction mixture was poured into 1.5 l of methanol to yield 63 g of a white resin (Resin (b)). The weight average molecular weight of this resin was determined to be 27,000 by GPC measurement.

To a 33.2 g portion of Resin (b), 87.6 g of a 25% aqueous solution of tetramethylammonium hydroxide and 400 ml of methanol were added, and heated under reflux for 5 hours. The resulting reaction mixture was neutralized with acetic acid, and poured into 4 l of ion-exchanged water. The thus precipitated resin was filtered off, and washed with water. As a result of drying at 40° C. under reduced pressure, 22 g of a white resin (Resin (c)) was obtained. It was confirmed by the NMR measurement of Resin (c) that the acetoxy groups in Resin (b) were converted into OH groups due to hydrolysis. In addition, the weight average molecular weight of Resin (c) was determined to be 24,500 by GPC measurement.

A 12.9 g portion of Resin (c) was dissolved in 60 ml of THF. To this solution, 3.0 g (0.030 mol) of t-butyl vinyl ether was added, and further 0.82 g of a solution containing 90 mg of p-toluenesulfonic acid in 100 g of THF was added as a catalyst, followed by 24-hour stirring at room temperature. The resulting reaction mixture was passed through a basic ion-exchange resin column to remove the catalyst, and then poured into 3 l of ion-exchanged water with stirring. Thus, 14 g of a white resin was obtained. The weight average molecular weight of this resin was determined to be 25,800 by GPC measurement. By NMR and TGA measurements, this resin was confirmed to be the resin corresponding to the present Compound Example (28) (wherein the total rate of substitution of two kinds of groups for OH groups was 30%).

In analogy with the aforementioned resin syntheses, there were synthesized the resins corresponding to the present Compound Examples (3), (4), (7), (10), (13), (14), (17), (21) and (30).

Syntheses of Dissolution Inhibitive Compounds

Synthesis Example 1

To a solution containing 20 g of α, α', α"-tris(4-hydroxyphenyl)-1,3,5-triisopropylbenzene in 400 ml of tetrahydrofuran, 14 g of potassium tert-butoxide was added in an atmosphere of nitrogen, and stirred for 10 minutes at room temperature. Then, 29.2 g of di-tert-butyldicarbonate was further added thereto. In the resulting solution was run the reaction for 3 hours at room temperature, and the reaction mixture obtained was poured into ice-cold water, followed by extraction of the reaction product with ethyl acetate. Further, the ethyl acetate layer was washed with water, dried and then distilled to remove the solvent. The crystalline solid obtained was recrystallized from diethyl ether, and dried. Thus, 25.6 g of Compound Example 31 (all R groups=t-BOC groups) was obtained.

Synthesis Example 2

To a solution containing 20 g of α, α', α"-tris(4-hydroxyphenyl)-1,3,5-triisopropylbenzene in 400 ml of diethyl ether, 31.6 g of 3,4-dihydro-2H-pyran and a catalytic amount of hydrochloric acid were added in an atmosphere of nitrogen, and the reaction was carried out therein for 24 hours under reflux. At the conclusion of the reaction, the resulting solution was admixed with a small amount of sodium hydroxide and filtered. The solvent was distilled away from the filtrate, and the product obtained was purified by column chromatography, and dried. Thus, Compound Example 31 (all R groups=THP groups) was obtained.

Synthesis Example 3

To a solution containing 19.2 g (0.040 mol) of α, α', α"-tris(4-hydroxyphenyl)-1,3,5-triisopropylbenzene in 120 ml of N,N-dimethylacetamide were added 21.2 g (0.15 mol) of potassium carbonate and 27.1 g (0.14 mol ) of t-butyl bromoacetate. The resulting solution was stirred for 7 hours at 120° C. The reaction mixture obtained was poured into 1.5 l of water, and then extracted with ethyl acetate. After drying with magnesium sulfate, the extracts obtained was concentrated, and purified by column chromatography (carrier: silica gel, developing solvent: ethyl acetate/n-hexane (3/7 by volume) mixture). Thus, 30 g of light yellow viscous solid was obtained. This solid was confirmed to be Compound Example 31 (all R groups=—$CH_2COOC_4H_9(t)$) by NMR measurement.

Synthesis Example 4

1-[α-Methyl-α-(4'-hydroxyphenyl)ethyl]-4-[α', α'-bis(4"-hydroxyphenyl)ethyl]benzene in an amount of 42.4 g (0.10 mol) was dissolved in 300 ml of N,N-dimethylacetamide, and thereto 49.5 g (0.35 mol) of potassium carbonate and 84.8 g (0.33 mol) of cumyl bromoacetate were added. The resulting solution was stirred for 7 hours at 120° C. The reaction mixture obtained was poured into 2 l of ion- exchanged water, neutralized with acetic acid, and then extracted with ethyl acetate. The extracts obtained was concentrated, and purified in the same manner as in Synthesis Example-3. Thus, 70 g of Compound Example 18 (all R groups=—$CH_2COOC(CH_3)_2C_6H_5$ groups) was obtained.

Synthesis Example 5

To a solution containing 14.3 g (0.020 mol) of α, α, α', α', α", α"-hexakis(4-hydroxyphenyl)-1,3,5-triethylbenzene in 120 ml of N,N-dimethylacetamide, 21.2 g (0.15 mol) of potassium carbonate and further 27.1 g (0.14 mol ) of t-butyl bromoacetate were added. The resulting solution was stirred for 7 hours at 120° C. The reaction mixture obtained was poured into 1.5 l of water, and then extracted with ethyl acetate. After drying with magnesium sulfate, the extracts obtained was concentrated, and purified by column chromatography (carrier: silica gel, developing solvent: ethyl acetate/n-hexane (2/8 by volume) mixture). Thus, 24 g of light yellow powder was 7- obtained. This yellow powder was confirmed to be Compound Example 62 (all R groups=—$CH_2$—COO—$C_4H_9(t)$ groups) by NMR measurement.

Synthesis Example 6

To a solution containing 20 g (0.042 mol) of α, α', α"-tris(4-hydroxyphenyl)-1,3,5-triisopropylbenzene in 400 ml of tetrahydrofuran (THF), 9.3 g of potassium tert-butoxide was added in an atmosphere of nitrogen, and stirred for 10 minutes at room temperature. Then, 19.5 g (0.087 mol) of di-tert-butyldicarbonate was further added thereto. In the resulting solution was run the reaction for 3 hours at room temperature, and the reaction mixture obtained was poured into ice-cold water, followed by extraction of the reaction product with ethyl acetate.

The extracts obtained was concentrated, and isolated and purified by column chromatography (carrier: silica gel, developing solvent: ethyl acetate/n-hexane (⅕ by volume) mixture). Thus, 7 g of Compound Example 31 (two R groups=t -BOC groups; one R group=a hydrogen atom) was obtained.

Synthesis Example 7

To a solution containing 48.1 g (0.10 mol) of α, α', α"-tris(4-hydroxyphenyl)-1,3,5-triisopropylbenzene in 300 ml of dimethylacetamide, 22.1 g (0.16 mol) of potassium carbonate and 42.9 g (0.22 mol) of t-butyl bromoacetate were added thereto. The resulting solution was stirred for 5 hours at 120° C. The reaction mixture obtained was poured into 2 l of ion-exchanged water, neutralized with acetic acid, and then extracted with ethyl acetate.

The extracts obtained was concentrated, and isolated and purified by column chromatography (carrier: silica gel, developing solvent: ethyl acetate/n-hexane (⅕ by volume) mixture). Thus, 10 g of Compound Example 31 (two R groups=—$CH_2$—COO—$C_4H_9$(t) groups; one R group=a hydrogen atom) was obtained.

Preparations and Evaluation of Photosensitive Compositions

The formulations for preparing resist solutions by using the compounds synthesized in the above-described manners are shown in Table 1.

TABLE 1

Formulation of Photosensitive Compositions

| Photo-sensitive Composition | Resin | Amount Added | Photoacid Generator | Amount Added | Additive(s) (Dissolution Inhibitor, Alkali-soluble Resin) | Amount Added |
|---|---|---|---|---|---|---|
| Example 1 | (1) | 1.8 g | PAG (4-5) | 0.1 g | — | |
| Example 2 | (3) | 1.8 g | PAG (4-5) | 0.1 g | — | |
| Example 3 | (4) | 1.8 g | PAG (4-5) | 0.1 g | — | |
| Example 4 | (7) | 1.8 g | PAG (5-7) | 0.1 g | — | |
| Example 5 | (10) | 1.8 g | PAG (4-5) | 0.1 g | — | |
| Example 6 | (13) | 1.8 g | PAG (4-5) | 0.1 g | — | |
| Example 7 | (14) | 1.8 g | PAG (6-6) | 0.1 g | — | |
| Example 8 | (17) | 1.8 g | PAG (5-7) | 0.1 g | — | |
| Example 9 | (21) | 1.8 g | PAG (4-5) | 0.1 g | — | |
| Example 10 | (28) | 1.8 g | PAG (4-5) | 0.1 g | — | |
| Example 11 | (30) | 1.8 g | PAG (5-5) | 0.1 g | — | |
| Example 12 | (1) | 1.5 g | PAG (4-5) | 0.1 g | Dissolution Inhibitor (16) | 0.3 g |
| Example 13 | (3) | 1.5 g | PAG (4-5) | 0.1 g | Dissolution Inhibitor (18) | 0.3 g |
| Example 14 | (4) | 1.5 g | PAG (5-5) | 0.1 g | Dissolution Inhibitor (31) | 0.3 g |
| Example 15 | (13) | 1.5 g | PAG (6-15) | 0.1 g | Dissolution Inhibitor (62) | 0.3 g |
| Example 16 | (14) | 1.5 g | PAG (4-5) | 0.1 g | Dissolution Inhibitor (41) | 0.3 g |
| Example 17 | (28) | 1.5 g | PAG (4-5) | 0.1 g | Dissolution Inhibitor (60) | 0.3 g |
| Example 18 | (1) | 1.2 g | PAG (4-5) | 0.1 g | Dissolution Inhibitor (18) PHS/OHS | 0.3 g 0.3 g |
| Example 19 | (17) | 1.4 g | PAG (4-5) | 0.1 g | PHS/St | 0.4 g |
| Example 20 | (30) | 1.2 g | PAG (4-5) | 0.1 g | Dissolution Inhibitor (60) PHS/St | 0.3 g 0.3 g |
| Comparative Example 1 | PHS/TBES | 1.8 g | PAG (4-5) | 0.1 g | — | |
| Comparative Example 2 | PHS/TBCMS | 1.8 g | PAG (4-5) | 0.1 g | — | |
| Comparative Example 3 | (PHS/TBES)/ (PHS/TBCMS) | 1.2 g/ 0.6 g | PAG (4-5) | 0.1 g | — | |
| Comparative Example 4 | PHS/THPS | 1.2 g | PAG (4-5) | 0.1 g | Dissolution Inhibitor (60) PHS/St | 0.3 g 0.3 g |

In the resins of the present invention, the ratio l/m/n was about 70/10/20 by mol and the ratio l/m/n/p was about 60/10/20/10 by mol.
The acid-decomposable group in the dissolution inhibitors used was —O—$CH_2$—COO$C_4H_9$(t).

The abbreviations used in Table 1 are as follows. PHS/St: p-hydroxystyrene/styrene (85/15 by mol) copolymer (weight average molecular weight: 25,000)

PHS/OHS: p-hydroxystyrene/o-hydroxystyrene (80/20 by mol) copolymer (weight average molecular weight: 32,000)

PHS/TBES: p-hydroxystyrene/1-t-butoxyethoxystyrene (70/30 by mol) copolymer (weight average molecular weight: 12,000)

PHS/TBCMS: p-hydroxystyrene/t-butoxycarbonyl-methyloxystyrene (70/30 by mol) copolymer (weight average molecular weight: 13,000)

PHS/THPS: p-hydroxystyrene/p-2-tetrahydropyranyloxy-styrene (60/40 by mol) copolymer (weight average molecular weight: 13,000)

Each group of the ingredients as set forth in Table 1 was admixed with 0.03 g of 4-dimethylaminopyridine, dissolved in 9.5 g of propylene glycol monomethylether acetate, and then passed through a 0.2 $\mu$m filter, thereby preparing a resist solution. This resist solution was coated on a silicon wafer by means of a spin coater, and dried for 60 seconds at 120° C. on a hot plate of vacuum adsorption type, thereby forming a 0.83 $\mu$m-thick resist film.

Each of the thus formed resist films was divided into two pieces, and exposed by means of a 248 nm KrF excimer laser stepper (NA=0.42). Immediately after the exposure, one piece of each film was heated for 60 seconds with a 100° C. hot plate of vacuum adsorption type, followed at once by 60-second dipping in a 2.38% aqueous solution of tetram-ethylammonium hydroxide (TMAH). Further, it was rinsed with water for 30 seconds, and then dried. The other piece of each film was allowed to stand for 1 hour after the exposure, and then heated, developed, rinsed and dried under the same condition as described above. The patterns thus formed on the silicon waters were each examined for profile, sensitivity and resolution, and evaluated as follows:

Profile

The shape of each pattern on the silicon wafer was observed under a scanning electron microscope, and thereby the resist profile was evaluated.

Sensitivity

The sensitivity was defined as the exposure amount required for the reproduction of a 0.40 $\mu$m mask pattern.

Resolution

The resolution was represented by the threshold resolution under the exposure amount required for the reproduction of a 0.40 $\mu$m mask pattern.

The evaluation results are shown in Table 2.

TABLE 2

Evaluation Results

| Resist Sample | <Heating just after Exposure> | | | <Heating after 1-hour lapse from Exposure> | | |
|---|---|---|---|---|---|---|
| | Sensitivity (mJ/cm$^2$) | Resolution ($\mu$m) | Profile of Resist Pattern | Sensitivity (mJ/cm$^2$) | Resolution ($\mu$m) | Profile of Resist Pattern |
| Example 1 | 17 | 0.28 | rectangle | 18 | 0.28 | rectangle |
| Example 2 | 18 | 0.28 | " | 18 | 0.28 | " |
| Example 3 | 20 | 0.28 | " | 20 | 0.28 | " |
| Example 4 | 24 | 0.30 | " | 24 | 0.30 | " |
| Example 5 | 23 | 0.28 | " | 23 | 0.28 | " |
| Example 6 | 19 | 0.28 | " | 19 | 0.28 | " |
| Example 7 | 25 | 0.30 | " | 25 | 0.30 | " |
| Example 8 | 25 | 0.28 | " | 25 | 0.28 | " |
| Example 9 | 22 | 0.30 | " | 23 | 0.30 | " |
| Example 10 | 21 | 0.30 | " | 22 | 0.30 | " |
| Example 11 | 23 | 0.28 | " | 24 | 0.28 | " |
| Example 12 | 18 | 0.28 | " | 18 | 0.28 | " |
| Example 13 | 19 | 0.28 | " | 19 | 0.28 | " |
| Example 14 | 22 | 0.30 | " | 22 | 0.30 | " |
| Example 15 | 23 | 0.30 | " | 24 | 0.30 | " |
| Example 16 | 20 | 0.28 | " | 20 | 0.28 | " |
| Example 17 | 21 | 0.28 | " | 21 | 0.28 | " |
| Example 18 | 17 | 0.28 | " | 17 | 0.28 | " |
| Example 19 | 16 | 0.30 | " | 17 | 0.30 | " |
| Example 20 | 16 | 0.28 | " | 16 | 0.28 | " |
| Comparative Example 1 | 25 | 0.30 | " | 25 | 0.30 | thinning |
| Comparative Example 2 | 27 | 0.28 | " | 35 | 0.36 | T-top* |
| Comparative Example 3 | 24 | 0.28 | " | 28 | 0.32 | somewhat thinning, somewhat T-top* |
| Comparative Example 4 | 22 | 0.32 | somewhat tapering | 24 | 0.34 | somewhat tapering, somewhat thinning |

*) T-top: The surface of the resist has T shape.

As can be seen from Table 2, all the resist films using the present positive working photosensitive compositions had satisfactory pattern profile, high sensitivity and high resolution. Moreover, the resist films according to the present invention underwent no change in resolution and profile by the lapse of time after exposure. On the other hand, the resist films for comparison (comparative examples 1 to 4) underwent deterioration in resolution and profile due to lapse of time after exposure, so that they were shown to be inferior to the present ones.

The present positive working photosensitive composition of chemical amplification type can produce an enhanced dissolution accelerating effect after exposure to make improvement in developability, and further enables the positive photoresist made therefrom to undergo no changes in pattern shape and sensitivity with a lapse of time after exposure to effect improvements in sensitivity, resolution and pattern profile.

While the invention has been described in detail with reference to specific embodiments, it will be apparent to one skilled in the art that various changes and modifications can be made to the invention without departing from its spirit and scope.

What is claimed is:

1. A positive working photosensitive composition comprising (1) a resin having repeating units represented by the following formulae (I), (II) and (III):

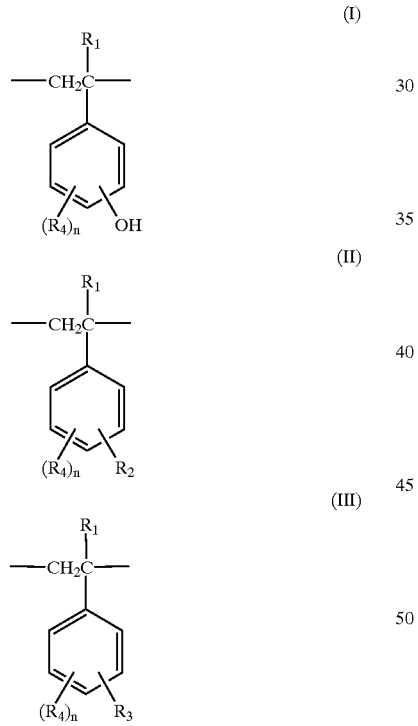

wherein $R_1$ represents a hydrogen atom or a methyl group;

$R_2$ represents —C(=O)—O—C($R_6$) ($R_7$) ($R_8$) or —O—$R_5$—C(=O)—O—C($R_6$) ($R_7$) ($R_8$);

$R_3$ represents —O—C($R_6$) ($R_7$) ($R_8$), —O—Si ($R_6$) ($R_7$) ($R_8$) or —O—C($R_9$) ($R_{10}$)—O$R_{11}$;

$R_4$ represents a hydrogen atom, a halogen atom, an alkyl group, an aryl group, an alkoxy group, an acyl group or an acyloxy group;

$R_5$ represents an alkylene group;

$R_6$, $R_7$, $R_8$, $R_9$ and $R_{10}$, which may be the same or different, each represents a hydrogen atom, an alkyl group, a cycloalkyl group or an alkenyl group, provided that at least two among $R_6$, $R_7$ and $R_8$, are groups other than a hydrogen atom and further provided that when $R_2$ represents an —O—$R_5$—C(=O)—O—C($R_6$) ($R_7$) ($R_8$) group, and two of $R_6$, $R_7$ and $R_8$ are alkyl groups, then the remaining $R_6$, $R_7$ or $R_8$ group represents a hydrogen atom, a cycloalkyl group, an alkenyl group or a phenyl group;

$R_{11}$ represents an alkyl group or an aryl group;

two groups among $R_6$, $R_7$ and $R_8$ may be combined to form a ring;

two groups among $R_9$, $R_{10}$, and $R_{11}$ may be combined to form a ring; and n is an integer from 1 to 3; and (2) a compound which generates an acid with irradiation of an active ray or radiation, which compound is selected from the group consisting of PAG1 to PAG3 and PAG5 to PAG6:

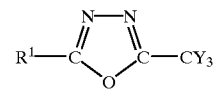

(PAG1)

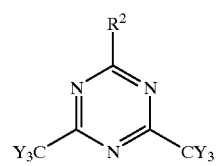

(PAG2)

wherein $R^1$ represents an aryl croup or alkenyl group, each of which may be substituted or unsubstituted, $R^2$ represents an aryl group, alkenyl group or alkyl group, each of which may be substituted or unsubstituted, or represents —$CY_3$, and Y represents a chlorine atom or a bromine atom:

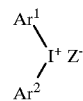

(PAG3)

wherein $Ar^1$ and $Ar^2$ each independently reiresents a substituted or unsubstituted aryl group;

and $Z^-$ represents an anion;

wherein $Ar^1$ and $Ar^2$ may be bonded to each other via a single bond or a substituent;

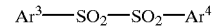

(PAG5)

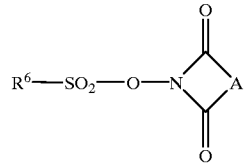

(PAG6)

wherein $Ar^3$ and $Ar^4$ independently represent a substituted or unsubstituted aryl group, $R^6$ represents an alkyl group or aryl group, each of which may be substituted or unsubstituted, and A represents an alkylene group, alkenylene group or arylene group, each of which may be substituted or unsubstituted.

2. The positive working photosensitive composition of claim 1, further comprising a low molecular acid-decomposable dissolution inhibitive compound which has a molecular weight of 3,000 or less and a group capable of decomposing with an acid and can increase its solubility in an alkali developer by undergoing the action of an acid.

3. The positive working photosensitive composition of claim 1, further comprising a resin insoluble in water but soluble in an alkaline aqueous solution.

4. The positive working photosensitive composition of claim 2, further comprising a resin insoluble in water but soluble in an alkaline aqueous solution.

5. A positive working photosensitive composition comprising (1) a resin having repeating units represented by the following formulae (I), (II) and (III):

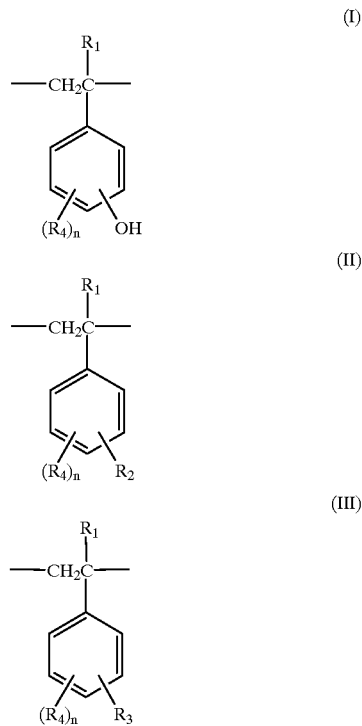

wherein $R_1$ represents a hydrogen atom or a methyl group;
$R_2$ represents —C(=O)—O—C($R_6$) ($R_7$) ($R_8$) or —O—$R_5$—C (=O) —O—C ($R_6$) ($R_7$) ($R_8$);
$R_3$ represents —O—C($R_6$) ($R_7$) ($R_8$), —O—Si ($R_6$) ($R_7$) ($R_8$) or —O—C ($R_9$) ($R_{10}$) —O$R_{11}$;
$R_4$ represents a hydrogen atom, a halogen atom, an alkyl group, an aryl group, an alkoxy group, an acyl group or an acyloxy group;
$R_5$ represents an alkylene group;
$R_6$, $R_7$, $R_8$, $R_9$ and $R_{10}$, which may be the same or different, each represents a hydrogen atom, an alkyl group, a cycloalkyl group or an alkenyl group, provided that at least two among $R_6$, $R_7$ and $R_8$ are groups other than a hydrogen atom, and further provided that when $R_2$ represents an —O—$R_5$—C(=O)—O—C($R_6$) ($R_7$) ($R_8$) group, and two of $R_6$, $R_7$ and $R_8$ are alkyl groups, then the remaining $R_6$, $R_7$ or $R_8$ group is a hydrogen atom, a cycloalkyl group, an alkenyl group or a phenyl group;
$R_{11}$ represents an alkyl group or an aryl group;
two groups among $R_6$, $R_7$ and $R_8$ may be combined to form a ring;
two groups among $R_9$, $R_{10}$, and $R_{11}$ may be combined to form a ring; and
n is an integer from 1 to 3; and
(2) a compound represented by the following formula PAG4 which generates an acid with irradiation of an active ray or radiation:

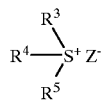

(PAG4)

wherein $R^3$, $R^4$, and $R^5$ each independently represents an alkyl group or aryl group, each of which may be substituted or unsubstituted;

and $Z^-$ represents an anion;

wherein two of $R^3$, $R^4$ and $R^5$ may be bonded to each other via a single bond or a substituent.

6. The positive working photosensitive composition of claim 5, further comprising a low molecular acid-decomposable dissolution inhibitive compound which has a molecular weight of 3,000 or less and a group capable of decomposing with an acid, and which can increase its solubility in an alkali developer by undergoing the action of an acid.

7. The positive working photosensitive composition of claim 5, further comprising a resin insoluble in water but soluble in an alkaline aqueous solution.

8. The positive working photosensitive composition of claim 6, further comprising a resin insoluble in water but soluble in an alkaline aqueous solution.

* * * * *